United States Patent
Zhang

(10) Patent No.: US 7,934,184 B2
(45) Date of Patent: *Apr. 26, 2011

(54) INTEGRATED CIRCUIT DESIGN USING MODIFIED CELLS

(75) Inventor: Youping Zhang, Fremont, CA (US)

(73) Assignee: Takumi Technology Corporation, Santa Clara, CA (US)

( * ) Notice: Subject to any disclaimer, the term of this patent is extended or adjusted under 35 U.S.C. 154(b) by 903 days.

This patent is subject to a terminal disclaimer.

(21) Appl. No.: 11/273,685

(22) Filed: Nov. 14, 2005

(65) Prior Publication Data

US 2007/0113216 A1    May 17, 2007

(51) Int. Cl.
*G06F 17/50* (2006.01)
*G06F 9/45* (2006.01)

(52) U.S. Cl. ............ 716/106; 716/53; 716/54; 716/55; 716/132; 716/139

(58) Field of Classification Search .................... 716/10, 716/19, 21; 382/144; 257/207; 438/129
See application file for complete search history.

(56) References Cited

U.S. PATENT DOCUMENTS

| | | | |
|---|---|---|---|
| 5,242,770 A | 9/1993 | Chen et al. | |
| 5,447,810 A | 9/1995 | Chen et al. | |
| 5,858,580 A | 1/1999 | Wang et al. | |
| 5,978,501 A * | 11/1999 | Badger et al. | 382/144 |
| 6,194,252 B1 * | 2/2001 | Yamaguchi | 438/129 |
| 6,289,499 B1 | 9/2001 | Rieger et al. | |
| 6,335,130 B1 | 1/2002 | Chen et al. | |
| 6,425,117 B1 * | 7/2002 | Pasch et al. | 716/21 |
| 6,430,737 B1 | 8/2002 | Cobb et al. | |
| 6,505,327 B2 | 1/2003 | Lin | |
| 6,507,931 B2 | 1/2003 | Kotani et al. | |
| 6,668,367 B2 | 12/2003 | Cobb et al. | |
| 6,763,514 B2 | 7/2004 | Zhang | |
| 6,807,663 B2 * | 10/2004 | Cote et al. | 716/21 |
| 6,813,758 B2 | 11/2004 | Aleshin et al. | |
| 6,964,031 B2 * | 11/2005 | Kotani et al. | 716/19 |
| 7,103,870 B2 * | 9/2006 | Misaka et al. | 716/21 |
| 7,263,683 B1 * | 8/2007 | Capodieci | 716/21 |
| 7,627,837 B2 * | 12/2009 | Zhang | 716/2 |
| 2004/0205688 A1 | 10/2004 | Pierrat | |
| 2005/0193363 A1 * | 9/2005 | Gupta et al. | 716/19 |
| 2007/0124718 A1 * | 5/2007 | Kobayashi et al. | 716/19 |
| 2009/0182448 A1 * | 7/2009 | Mansfield et al. | 700/110 |
| 2010/0153904 A1 * | 6/2010 | Zhang | 716/21 |

OTHER PUBLICATIONS

Rieger et al., "Using Behavior Modelling for Proximity Correction," SPIE 1994.

* cited by examiner

*Primary Examiner* — Helen Rossoshek
(74) *Attorney, Agent, or Firm* — Hall Estill; William C. Milks, III

(57) ABSTRACT

An exemplary method for modifying at least part of an integrated circuit layout comprises obtaining an integrated circuit device layout, the integrated circuit device being designed using a library of cells, obtaining a modified library of cells, and replacing at least one cell in the integrated circuit device layout with a corresponding modified cell of the modified library to obtain a modified integrated circuit device layout. The modified library includes modified cells corresponding to cells in the library and candidate areas of each modified cell indicating portions of the cell for further processing. At least some of the modified cells have been modified to at least partially compensate for a manufacturing effect.

10 Claims, 24 Drawing Sheets

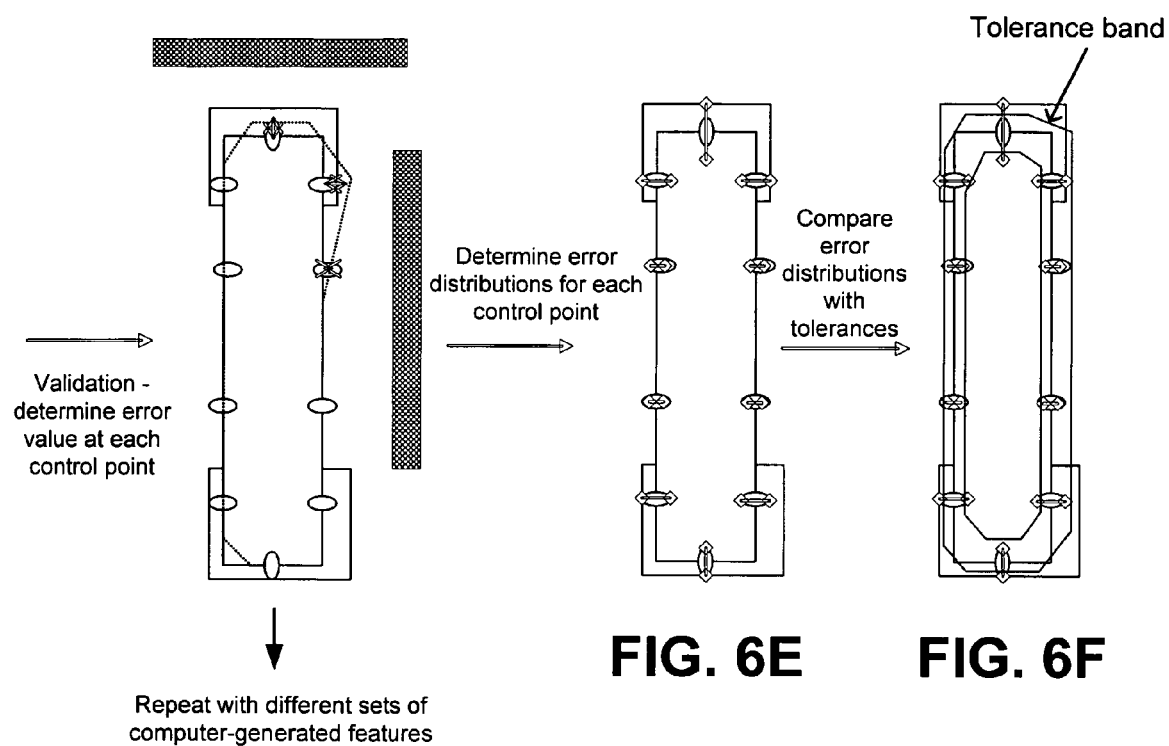

Candidate areas are the areas encompassing the invalid control points regular

Horizontal reflection

Vertical reflection 180 degree rotation

Gridding of Uncertain Region

Randomly Generated Features

INTEGRATED CIRCUIT DESIGN USING MODIFIED CELLS

BACKGROUND

Photolithography is a basic technique for forming patterns in semiconductor manufacturing processes. Photolithography generally involves: (1) coating a wafer with a photoresist material; (2) placing a mask having desired patterns (e.g., transparent pattern areas) above the wafer; and (3) exposing the mask and wafer to light. Light exposure causes a chemical reaction in the photoresist which enables the transfer (or printing) of the mask patterns. The wafer is then subject to a development process to remove portions of the photoresist while retaining the desired printed patterns. There are generally two types of photoresists: positive photoresist and negative photoresist. When a positive photoresist is used, the portions exposed to light are removed during development. When a negative photoresist is used, the portions unexposed to light are removed during development. For ease of explanation, throughout this application, various exemplary implementations are described as using the negative photoresist. One skilled in the art will readily recognize that the positive photoresist may be used instead in accordance with any specific design choices.

In semiconductor manufacturing, device miniaturization has been one of the most important research and development goals. One way to achieve this goal is to print (and develop) smaller features (e.g., contact holes) and/or place features closer to each other in the semiconductor devices, for example, by using masks having smaller pattern dimensions or closer-placed patterns. However, as a result of optical diffraction and/or other manufacturing effects, the printed image worsens as pattern dimensions or spacing become smaller. That is, as pattern dimensions or spacing shrink, light passing through the transparent areas on the mask may expose unintended areas around the transparent areas. The exposure of unintended areas causes a reduction in light contrast and results in degraded pattern resolution. Moreover, as the feature size of decreases, distortion in the pattern transfer process becomes more severe as a result of optical diffraction and other manufacturing effects. FIG. 1 illustrates an exemplary image (right figure) printed using the rectangular mask pattern shown on the left. In addition to optical diffraction, distortion and/or resolution losses may be (alternatively or in combination) caused by other non-optical manufacturing effects (e.g., chemical reaction effect, etching effect, etc.).

For ease of explanation, exemplary embodiments to be described herein may from time to time refer to distortions caused by an optical effect. However, one skilled in the art will recognize that other manufacturing effects (whether optical or non-optical) may, alternatively or in combination, cause the distortions to be corrected by the described exemplary embodiments and equivalent processes thereof.

In addition to distortions at the edges of the mask pattern for each feature, a printed image of a feature may also be distorted by optical diffraction from printing its neighboring features. This type of distortion may be explained with reference to FIG. 2. FIG. 2 illustrates an exemplary layout of features (e.g., polygons) on a circuit (e.g., a cell). In FIG. 2, the circuit includes three features (i.e., A, B, and C). As a result of their close proximity to each other, optical diffraction resulting from printing any one feature may cause a distortion in its neighboring features that are being printed at the same time.

The dotted lines in FIG. 2 surrounding each feature indicate an interactive range (or so-called ambit or halo) around each feature. The interactive range of a feature indicates an area from the edges of that feature within which a nearby feature is likely to significantly affect the printing of that feature. In general, the size of the interactive range may be selected based on the physics of the photolithography process (e.g., the size of the lens, the wavelength of light being used, type of resist materials, baking time, baking/annealing temperature, etc.).

FIG. 2 may alternatively be described as illustrating an exemplary layout of a device comprising multiple cells A, B, and C. An integrated circuit device typically comprises numerous cells. Each cell includes multiple layers of features (e.g., a polysilicon layer, a diffusion layer, a metal layer, a contact layer, etc.). In FIG. 2, the device includes three cells (i.e., A, B, and C). In this example, the dotted lines in FIG. 2 surrounding each cell indicate an interactive range (or so-called ambit or halo) around each cell. Like an interactive range around a feature, the size of the interactive range around each cell may be selected based on the physics of the photolithography process (e.g., the size of the lens, the wavelength of light being used, type of resist materials, baking time, baking/annealing temperature, etc.). For ease of explanation, distortions caused by printing a feature, printing neighboring features of a cell, and printing neighboring cells will be collectively referred to as proximity effects.

One technique to compensate for distortions (e.g., proximity effects) caused by manufacturing effect(s) is to use a so-called OPC (Optical Proximity Correction) process. For example, a layout OPC process may be performed on each feature within an integrated circuit layout to make appropriate mask modifications to compensate for proximity effects. Other mask correction processes (e.g., phase shift masks (PSM), scattering bars (SB), chromeless phase masks (CPM), layout modification through compaction, etc.) may be implemented depending on design choice. FIG. 3 illustrates an exemplary OPC process performed on a single layer of a cell (which may contain multiple features) to compensate for proximity effects.

In FIG. 3, a mask pattern is first divided into segments then evaluation points are placed on the segments. A simulation of a photolithographic process using the mask pattern is performed to determine any mismatches (i.e., as a result of proximity effects) at any of the evaluation points. The mismatches are determined by comparing the printed image to an intended image (or the so-called design intent). In FIG. 3, the dotted lines in the lower left figure indicate the printed image and the rectangles around some of the evaluation points indicate mismatches at those points. The mask pattern is modified to compensate (e.g., correct) for the mismatches so that the actual printed image will look more like the intended image. In the example shown in FIG. 3, the edges with the mismatches are moved outwardly by a calculated amount to compensate for the mismatches. The lower right figure in FIG. 3 illustrates the simulated image (see the dotted lines) printed using the modified mask pattern.

An OPC process typically includes an implicit validation process. Alternatively or in combination, a separate validation process may be performed after the OPC process. FIG. 4 will be referred to for explaining both the implicit and separate validation processes.

FIG. 4 illustrates an exemplary validation process that uses control points placed at various locations of a modified mask pattern to determine the processing quality of the previous modification process (e.g., an OPC process). The control points can be any points on a layout and are typically selected along the feature edges where the processing quality (e.g., mismatch, image slope, contrast, defocus latitude, etc.) can be measured. Next, a simulation of the photolithographic process using the modified mask pattern is performed to determine the printed pattern. If an OPC process is performed successfully, the OPC modified mask pattern should pass (as opposed to fail) the validation process with no mismatches outside the tolerances for that feature at any of the control points. Typically, after a successful OPC process, there will still be some small mismatches at some of the evaluation points. These small mismatches are generally within pre-specified tolerances for the pattern and can be referred to as residual errors.

The OPC process sometimes includes an implicit validation process, during which control points are chosen to be the same as the evaluation points. After mask pattern modifications, an implicit validation process can be performed at the evaluation points to determine whether remaining errors are within tolerance. If errors are not within tolerance, additional mask pattern modifications may be performed (e.g., by reverting back to the mask modification step in an OPC process) and another validation process is repeated until all mismatches are within pre-specified tolerances.

The above exemplary OPC process compensates for proximity effects within a cell. However, in practice, a mask correction process (e.g., an OPC process) has to account for proximity effects within a cell and proximity effects caused by printing of neighboring features of other cells. In a typical integrated circuit layout, a cell may appear multiple times at different locations. Each appearance of a cell in a layout may be referred to as a placement of the cell. Thus, a cell appearing at different locations may have different neighboring features. The different neighboring features may cause different amounts of proximity effects to the features of the cell. Consequently, the post-OPC layout typically has multiple copies of the same cell which contain different OPC results (for each type of placement). This process is very computationally intensive and can generate a huge volume of data.

Thus, a market exists for systems and processes to improve mask correction processes (e.g., the OPC process) which may reduce repeated corrections of the mask pattern for the same cell.

SUMMARY

An exemplary computer-implemented method for processing at least some cells of a library of cells usable for designing integrated-circuits comprises obtaining at least one parameter related to a cell, determining an uncertain region based on the parameter, determining a plurality of computer-generated features at least partially within the uncertain region to determine one or more candidate areas indicating portions of the cell for further processing, and outputting the cell and the candidate areas.

An exemplary method for modifying at least part of an integrated circuit layout comprises obtaining an integrated circuit device layout, the integrated circuit device being designed using a library of cells, obtaining a modified library of cells, and replacing at least one cell in the integrated circuit device layout with a corresponding modified cell of the modified library to obtain a modified integrated circuit device layout. The modified library includes modified cells corresponding to cells in the library and candidate areas of each modified cell indicating portions of the cell for further processing. At least some of the modified cells have been modified to at least partially compensate for a manufacturing effect (e.g., optical diffraction effect).

These and other exemplary embodiments and implementations are disclosed herein.

BRIEF DESCRIPTION OF THE FIGURES

FIGS. 6A-6H illustrate exemplary representations of the exemplary process of FIG. 5.

DETAILED DESCRIPTION

I. Overview

Figure 1:
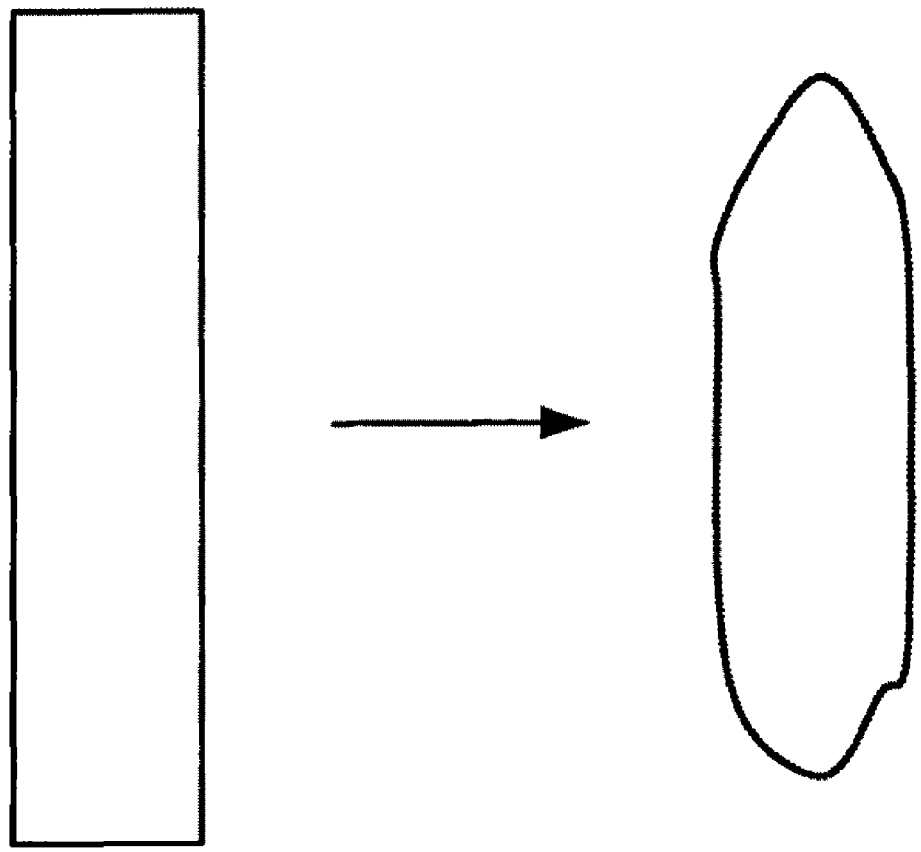
FIG. 1 illustrates an exemplary printed image after a conventional photolithography process.
Figure 2:
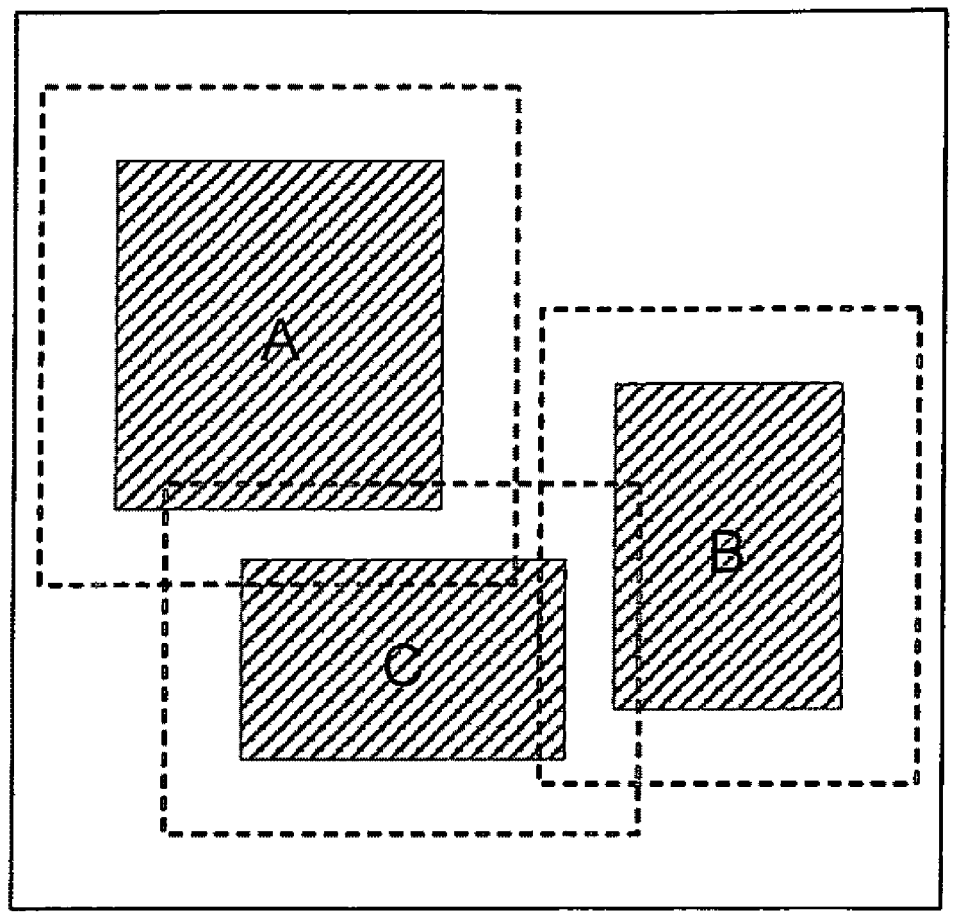
FIG. 2 illustrates an exemplary device having multiple features or cells.

Techniques for modifying photolithographic masks are disclosed herein. For ease of explanation, throughout this application, the exemplary embodiments described herein will use a conventional OPC process as an exemplary mask correction process. However, an OPC process is only one type of mask correction processes; thus, the exemplary embodiments described are not limited to implementing an OPC process. For example, and without limitation, other mask correction processes (e.g., phase shift masks (PSM), scattering bars (SB), chromeless phase masks (CPM), layout modification through compaction, etc.) may be implemented in accordance with the exemplary embodiments described herein.

Section II describes an exemplary process for modifying cells of a library.

Section III describes exemplary processes for determining candidate areas on each cell for further processing.

Section IV describes exemplary parameters of a standard cell in a library.

Section V describes exemplary processes for using modified libraries in a mask correction process, such as an OPC process, and using modified libraries to design integrated circuits.

Section VI describes an exemplary operating environment.

II. An Exemplary Process for Enhancing a Mask Correction Process

A. A Library of Cells

A library typically comprises circuit units (or so-called cells) with predefined basic circuit functions (e.g., invert or NOT, NAND, NOR, etc.), characteristics (e.g., timing, parasitics, etc.), geometrical specifications (e.g., minimum dimensions, minimum spacing, placement options, placement parameters, etc.), manufacturing tolerances, and other parameters relating to the library or each cell in the library. A cell typically comprises multiple layers of data (e.g., polysilicon layer, diffusion layer, contact layer, metal layer, etc.) to implement the predefined basic functions. Each layer of a cell typically includes multiple geometric features (e.g., polygons). An active region of a cell is a region within which all features of all layers of the cell are contained. Typically, an active cell region is derived based on parameters related to the cell and specified in the library.

Some device manufacturers design their own libraries in-house while others may outsource their library needs. Generally, different libraries are designed for different minimum feature size chips (e.g., 60 nm, 90 nm, etc.).

A chip designer designs an integrated circuit device layout or portions of a circuit layout (e.g., circuit blocks) using cells from several libraries. For example, based on the desired functions and other design considerations, a designer selects the appropriate libraries and cells within the libraries. Next, the designer places selected cells (e.g., in some topological order) and adds routing layers to interrelate the cells to achieve the desired functions. Each cell of a library can be placed multiple times in different orientations and at different locations of a circuit layout.

Layouts are typically constructed hierarchically. A larger cell can be created, as needed, by combining smaller cells. For instance, two of cell A and one of cell B from a library can be combined to achieve a function "ABA" which may be needed repeatedly in a circuit. In this example, a cell C comprising two placements of cell A and one placement of cell B can be created. The cell C can be referred to as a parent cell having two references to cell A and one reference to cell B. This process creates a layout hierarchy.

The references to other cells in a parent cell may be replaced with the geometric features of the other cells. In the previous example, the features of cells A and B can be copied into cell C (into their corresponding locations and orientations) and references to cells A and B can then be removed from cell C. This process may be referred to as flattening Circuit layouts typically undergoes a mask correction process (e.g., OPC) after the layout has been designed but before actual manufacturing. During mask correction, the mask patterns for each layer of each cell in the layout are corrected separately. Typically, original layout hierarchies may be altered and substantial flattening may occur during mask corrections.

B. An Exemplary Process for Modifying Cells of a Library

Exemplary embodiments described herein substantially modify cells at the library level to generate modified libraries. In an exemplary implementation, modified libraries (comprising modified cells) then may be used to design an integrated circuit device layout (or to modify a conventionally designed device layout prior to mask correction). In an exemplary implementation, the cells in modified libraries have been substantially modified to compensate for proximity effects except for certain portions of each cell indicated by the candidate areas of the cell as portions that may require further modification. Thus, instead of performing mask corrections for entire cells in a device layout, the conventional mask correction process may be performed on just the portions indicated by the candidate areas of each cell. Consequently, excessive duplication of at least some of the cells may be avoided. As a result, computational costs can be substantially reduced.

Figure 5:
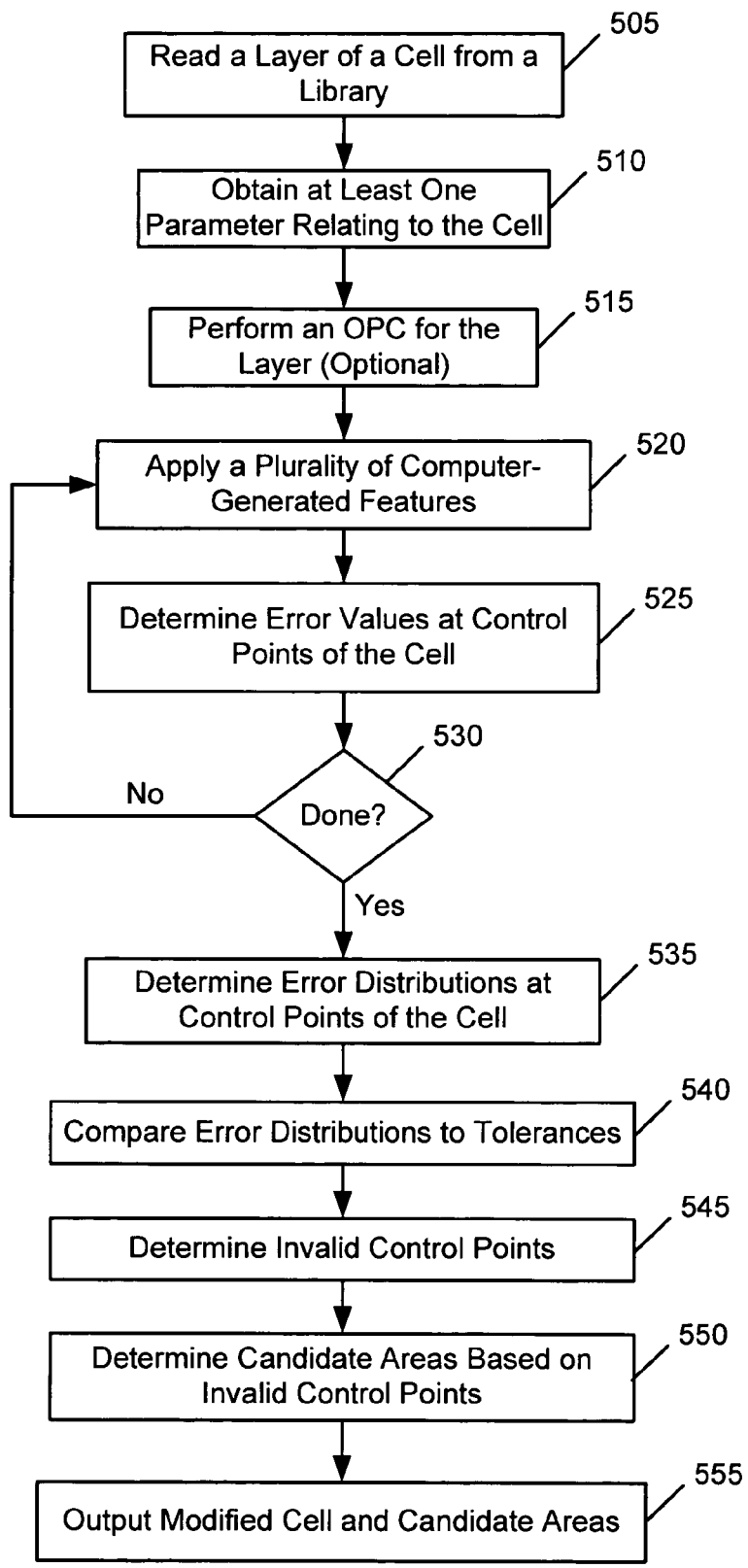
FIG. 5 illustrates an exemplary process for modifying cells in a library which may be used for designing integrated circuits.

FIG. 5 illustrates an exemplary overall process for modifying one layer (e.g., the polysilicon layer) of a cell in a library. One skilled in the art will recognize that the process of FIG. 5 can be repeated for modifying one or more layers (e.g., diffusion layer, metal layer, contact layer, etc.) of each cell in the library. Typically, a modified library includes modified cells each may have one or more modified layers. The number of layers to be modified in each cell may be determined depending on design choice. FIGS. 6A-6H illustrate exemplary representations of the process steps of FIG. 5.

Figures 6A, 6B, 6C:
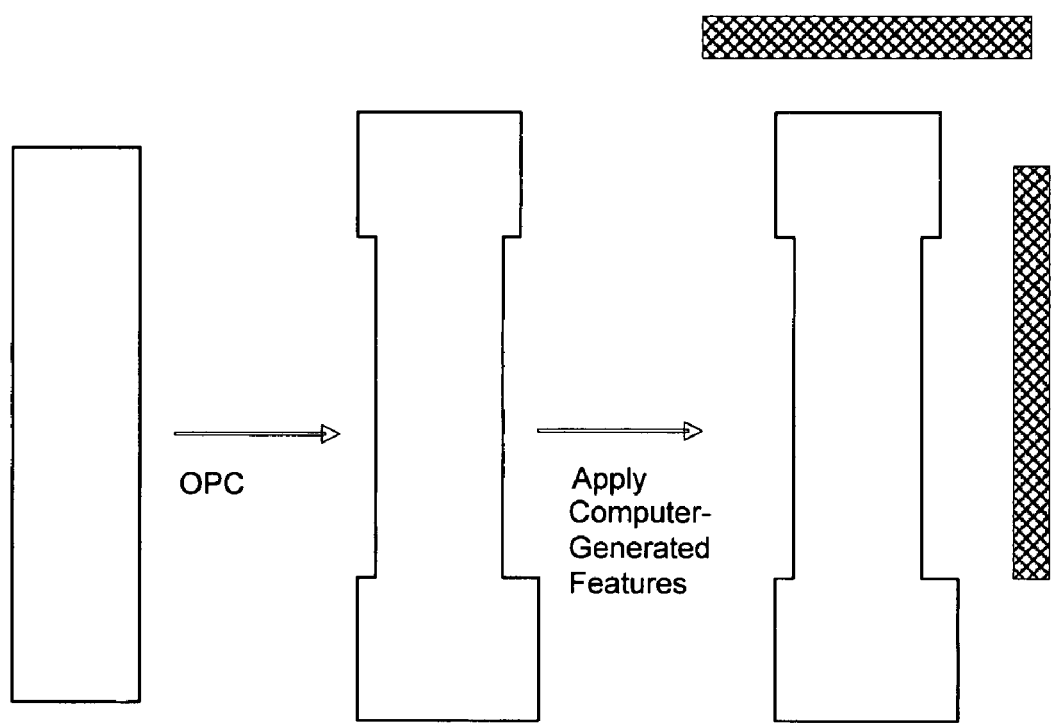

At step 505, a layer of a cell is read from a library. FIG. 6A illustrates a layer of a cell obtained from a library which includes a single rectangle geometry. For ease of explanation, the exemplary process will be explained as modifying the cell. One skilled in the art will recognize that a single iteration of this exemplary process modifies a layer of one cell. Modification of other layers of the cell or other cells will require additional iterations of the exemplary process.

At step 510, at least one parameter related to the cell is obtained. For example, one or more of cell dimensions, minimum feature dimension and spacing, placement parameters, manufacturing tolerances, and/or other parameters relating to each cell may be obtained from the library. In addition, one or more parameters related to the cell may be specific for a layer, a library or a manufacturing process. In an exemplary implementation, the parameters relating to the cell can be used to determine areas of the cell that may be affected by proximity effects. For example, the parameters related to the cell may be used to determine the active cell region and the uncertain region of a layer of the cell. An exemplary standard cell whose one or more parameters obtained from its library are used to determine its active cell region and uncertain regions will be described in more detail in Section IV below.

Figure 3:
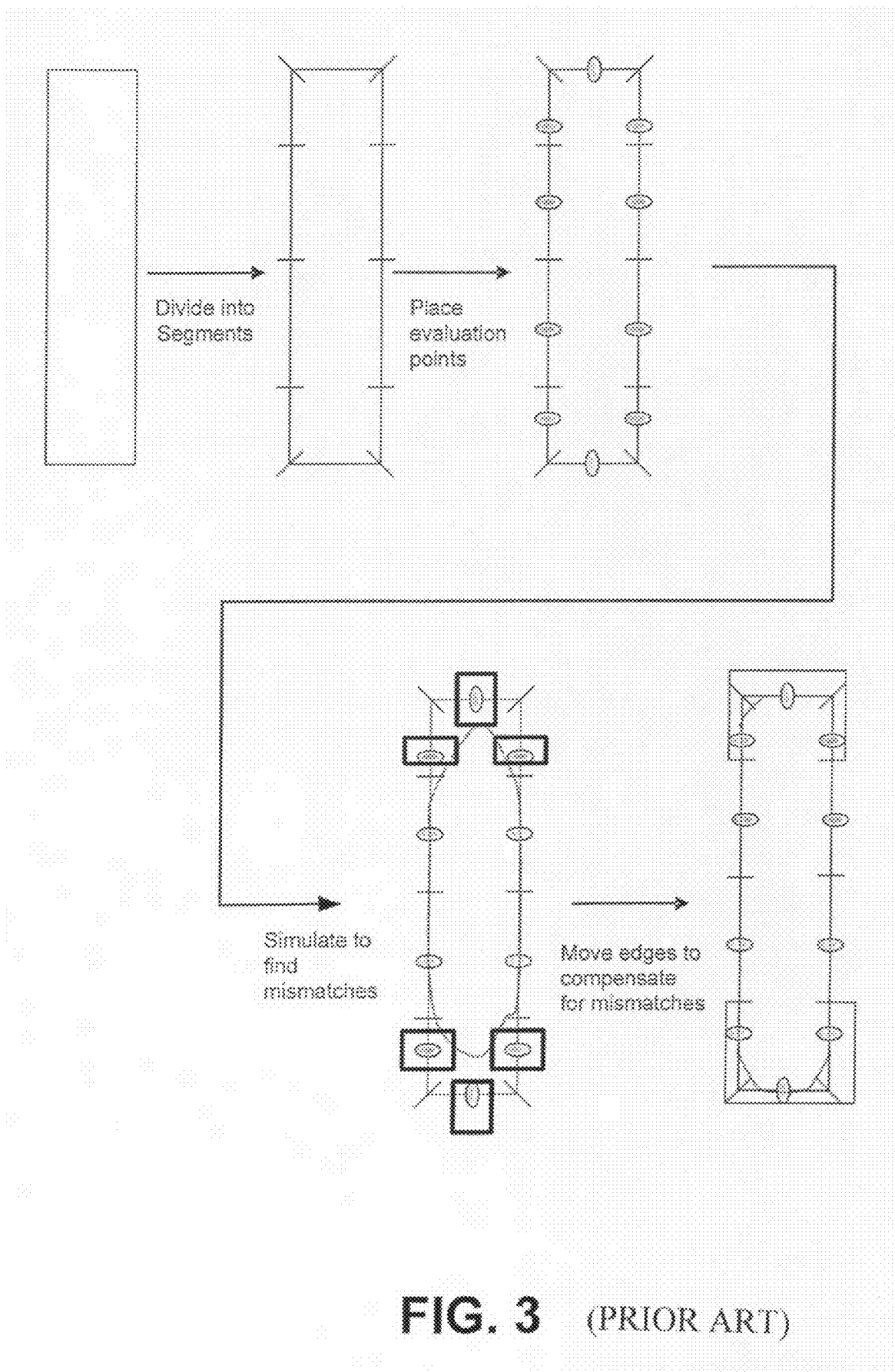
FIG. 3 illustrates an exemplary OPC process.

At step 515, a conventional mask correction process is applied. In an exemplary implementation, an OPC process is applied to determine mask corrections to compensate for proximity effects within the layer of the cell. For example, the exemplary process illustrated in FIG. 3 may be applied. When applying a conventional OPC process, an implicit validation process is typically performed at the evaluation points to validate the mask corrections. FIG. 6B illustrates the modified cell after applying a conventional mask correction process (e.g., an OPC process) and a validation process. In another exemplary implementation, step 515 may be skipped.

At step 520, a plurality of computer-generated features at least partially within the uncertain region of this layer of the cell is applied to determine any proximity effects which may partially invalidate the modifications made in the previous step. An uncertain region is an area near the cell where features from neighboring cells, if located within the region, may affect the printing of the features of the cell. This region is "uncertain" because one does not yet know what those neighboring features will be. An exemplary implementation for determining uncertain regions of a cell will be described in more detail in Section IV below. FIG. 6C illustrates exemplary computer-generated features (i.e., the shaded rectangles) near the modified cell.

Figure 16A:
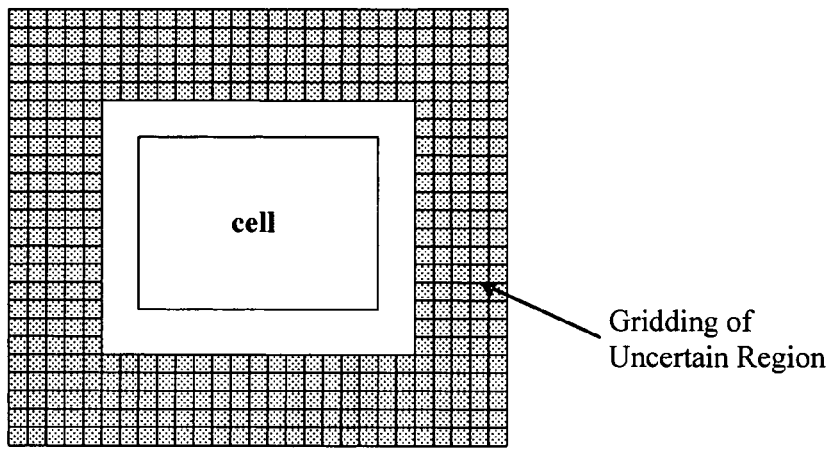
FIGS. 16A-B illustrate exemplary computer-generated features.
Figure 16B:
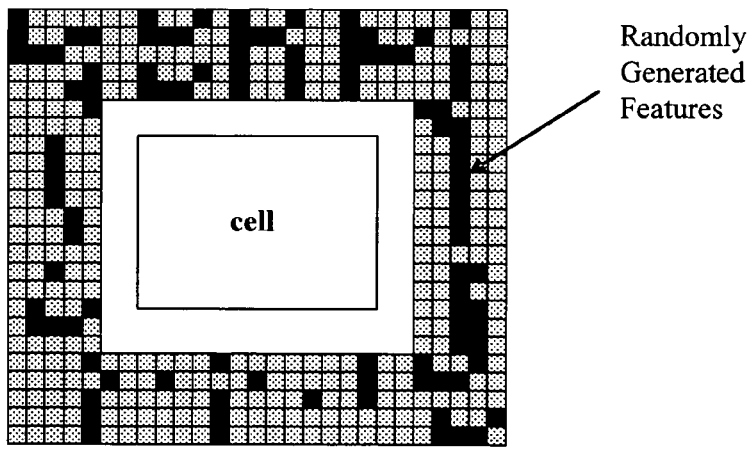

In an exemplary implementation, the computer-generated features are randomly generated. For example, the uncertain region may be partitioned into grids of a predetermined size then features may be generated by randomly selecting grids within the region. FIGS. 16A and 16B illustrate an exemplary grided uncertain region and exemplary randomly generated features within the grided region, respectively.

Figure 17:
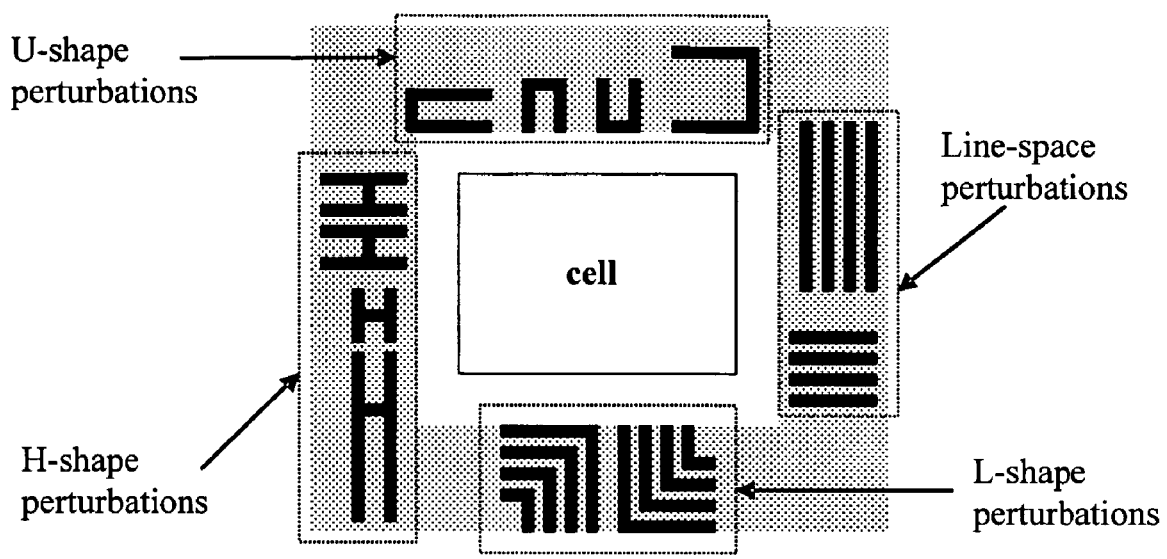
FIG. 17 illustrates other exemplary computer-generated features.

In another exemplary implementation, the computer-generated features may be systematically generated in accordance with a predefined formula. For example, predefined parameterized structures (e.g., line-space structures, L-structures, H-structures, U-structures, etc.) may be systematically used based on a set of parameters (e.g., line width, line spacing, line height, number of lines, location of structure in the uncertain region, etc.). FIG. 17 illustrates an exemplary set of systematically generated features within an uncertain region of a cell.

Figure 18:
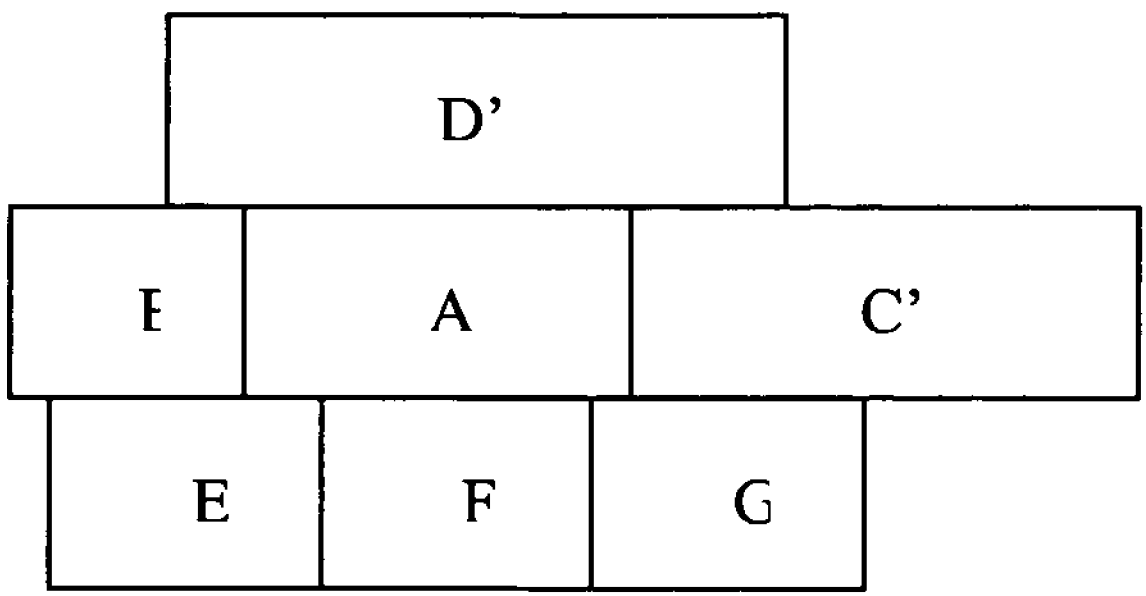
FIG. 18 illustrates yet other exemplary computer-generated features.

In yet another exemplary implementation, the computer-generated features may be generated using other library cells. For example, other cells from the library are chosen and placed near the cell being processed according to placement rules. The features of those other cells can be replicated within an uncertain region of the cell. In this implementation, different cell and placement combinations may be used as different sets of computer-generated features within the uncertain region of the cell. FIG. 18 illustrates an exemplary cell A surrounded by other cells as its computer-generated features within its uncertain region. The cells used as neighboring cells may be the original cells or the modified cells. In FIG. 18, cells B, E, F, and G are original cells of the library, and cells C' and D' are modified cells of C, D, respectively, from the library.

In an exemplary implementation, an optional step may be applied prior to step 515 above. This optional step includes applying a nominal set of computer-generated features near the cell for the OPC process to obtain an average of proximity effects to the cell caused by neighboring features. The selection of the nominal set of computer-generated features may be implemented in accordance with exemplary implementations described herein or other implementations that provide a good statistical average of possible neighboring features.

Figure 4:
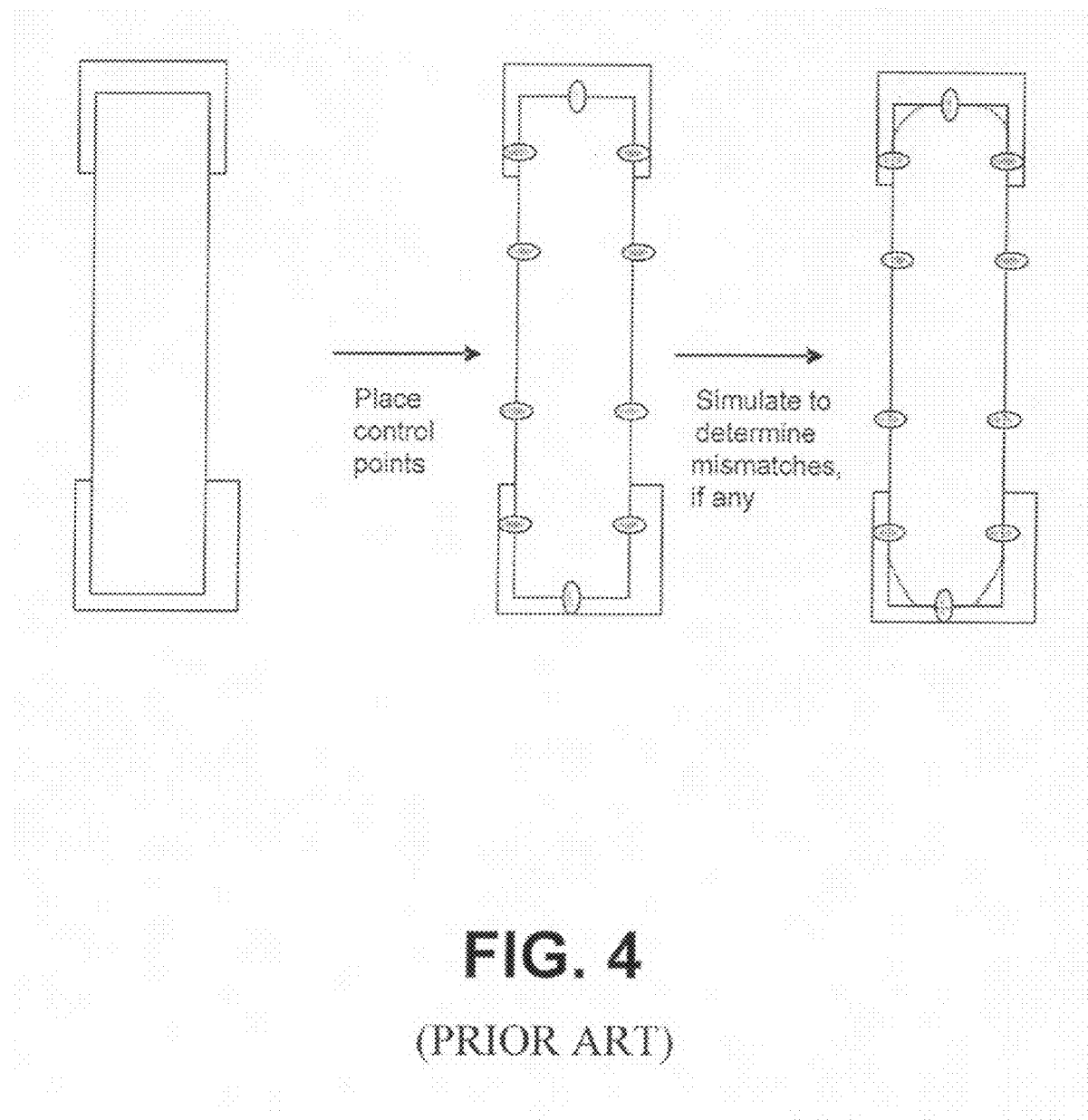
FIG. 4 illustrates an exemplary validation process.

At step 525, a validation process (e.g., the process of FIG. 4) is performed to determine a performance metric value for each control point on the cell. A control point may or may not be an evaluation point. In addition, same or different control points on a cell may be used in different validation processes. In the exemplary implementations described herein, the same control points are used for different iterations of the validation process (i.e., steps 520-530) for a given layer of a cell. Further, one skilled in the art will recognize that a validation process may be implemented based on representations other than discrete control points. For example, and without limitation, a validation process may be based on aerial image maps (i.e., a continuously valued 2D image showing a simulated light intensity level at each point within or around an active region), gradient image maps (i.e., a derivative of the aerial image map), or simulated image contours (i.e., a continuous curve showing a simulated silicon image).

A performance metric value may be used to determine the processing quality of a previous mask modification technique (if any). One skilled in the art will recognize that performance metric may include, without limitation, errors or mismatches between printed and intended image, image slopes or contrasts, mask error factors, dose and defocus latitudes, sensitivity to aberrations or flare, other metric, and/or a combination of the above. For ease of explanation, the exemplary implementation described in FIG. 5 will use errors (or error values) as an exemplary performance metric.

An error value represents an amount of distortion caused by the computer-generated features (plus any remaining residual error from the OPC process of step 515) at a control point on the cell. FIG. 6D illustrates an exemplary representation of error values determined after a validation process. In this Figure, the dotted lines represent the boundary of the simulated printed image after the validation process.

After an initial determination of error values at control points, one may continue on with one of two exemplary processes. The first exemplary process continues at step 530. The second exemplary process will be described with reference to FIG. 19 below.

At step 530, whether enough sets of computer-generated features have been applied is determined. If not, the process returns to step 520 and another set of computer-generated features at least partially within the uncertain region is applied to determine additional error values at the control points of the cell. In an exemplary implementation, multiple sets of computer-generated features are used to obtain a more statistically significant quantitative analysis.

Figure 7:
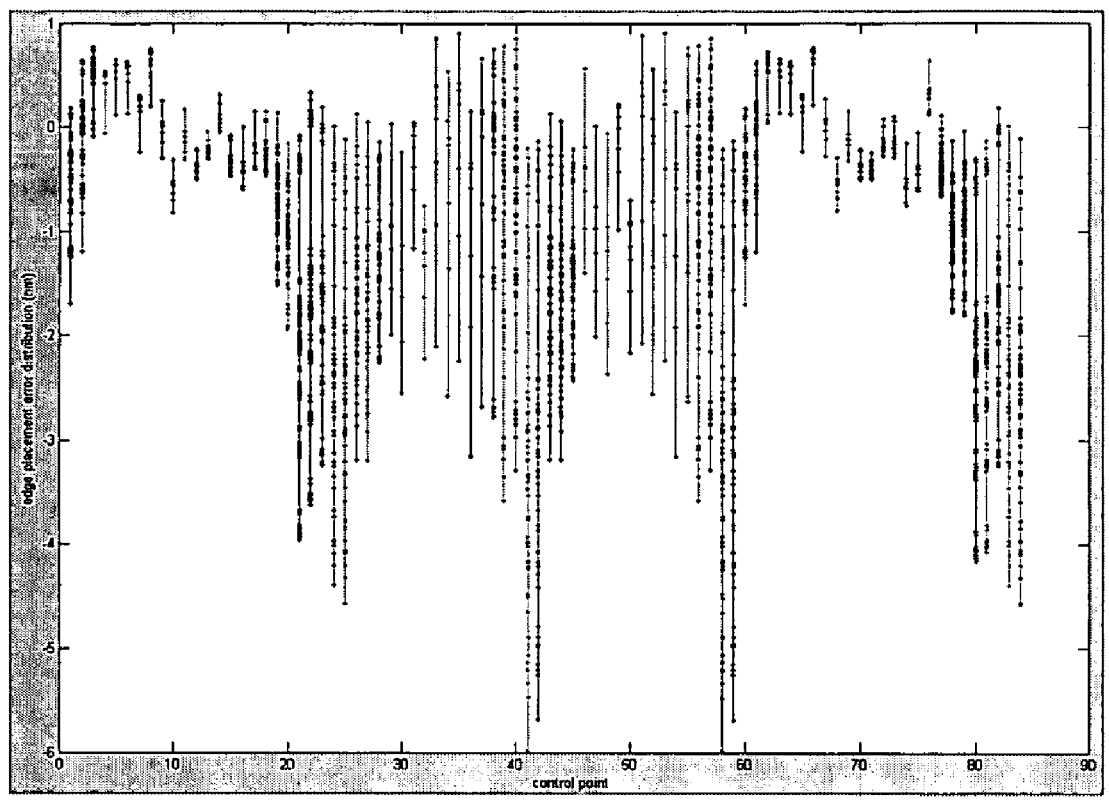
FIG. 7 illustrates an exemplary chart of error distributions at control points of a modified cell.

Referring back to step 530, if enough sets of computer-generated features have been applied, then at step 535, a distribution (or range) of error values at each control point is determined. FIG. 7 illustrates an exemplary chart of error distributions at multiple control points of a cell. FIG. 6E illustrates an exemplary representation of the error distributions at control points (the line with diamond ends at each control points shows the range of error values). The diamond ends of the error distribution at each control point indicate the minimum and maximum error values for that control point.

At step 540, the error distribution at each control point is compared to the tolerance at that point of the cell. In general, the design specifications of the library include tolerances for manufacturing errors for different patterns (e.g., transistor CD uniformity, end-caps shortening, contact enclosure margin, routing polysilicon CD variation, corner rounding, etc) of a cell. The boundaries of different patterns for the cell have to stay within the specified tolerances in order for the manufactured device to function properly. The tolerances for different patterns of a cell may be represented by an aggregate tolerance band. FIG. 6F illustrates an exemplary representation of a tolerance band for the cell.

Figures 6G, 6H:
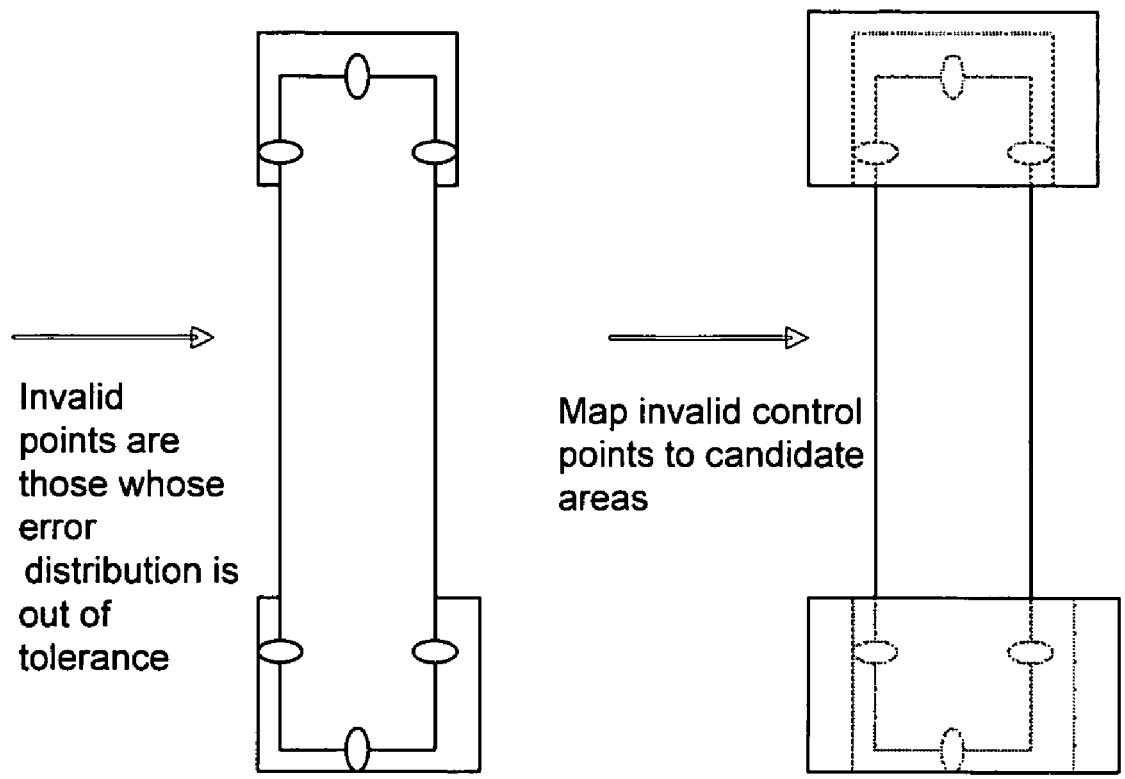

At step 545, invalid control points on the cell are determined. In an exemplary implementation, any control point having an error distribution outside of the tolerance is determined as invalid. FIG. 6G illustrates the exemplary invalid control points of the cell.

At step 550, candidate areas are determined based on the invalid control points. Candidate areas are collectively a form of output that identifies portions of the cell that may require further processing (e.g., an application of additional mask correction process(s)). In an exemplary implementation, candidate areas are polygonal areas mapped using the invalid control points. In another exemplary implementation, candidate areas are portions of the cell features (e.g., segments) containing the invalid control points. FIG. 6H illustrate an exemplary mapping of invalid control points shown in FIG.

Figure 8:
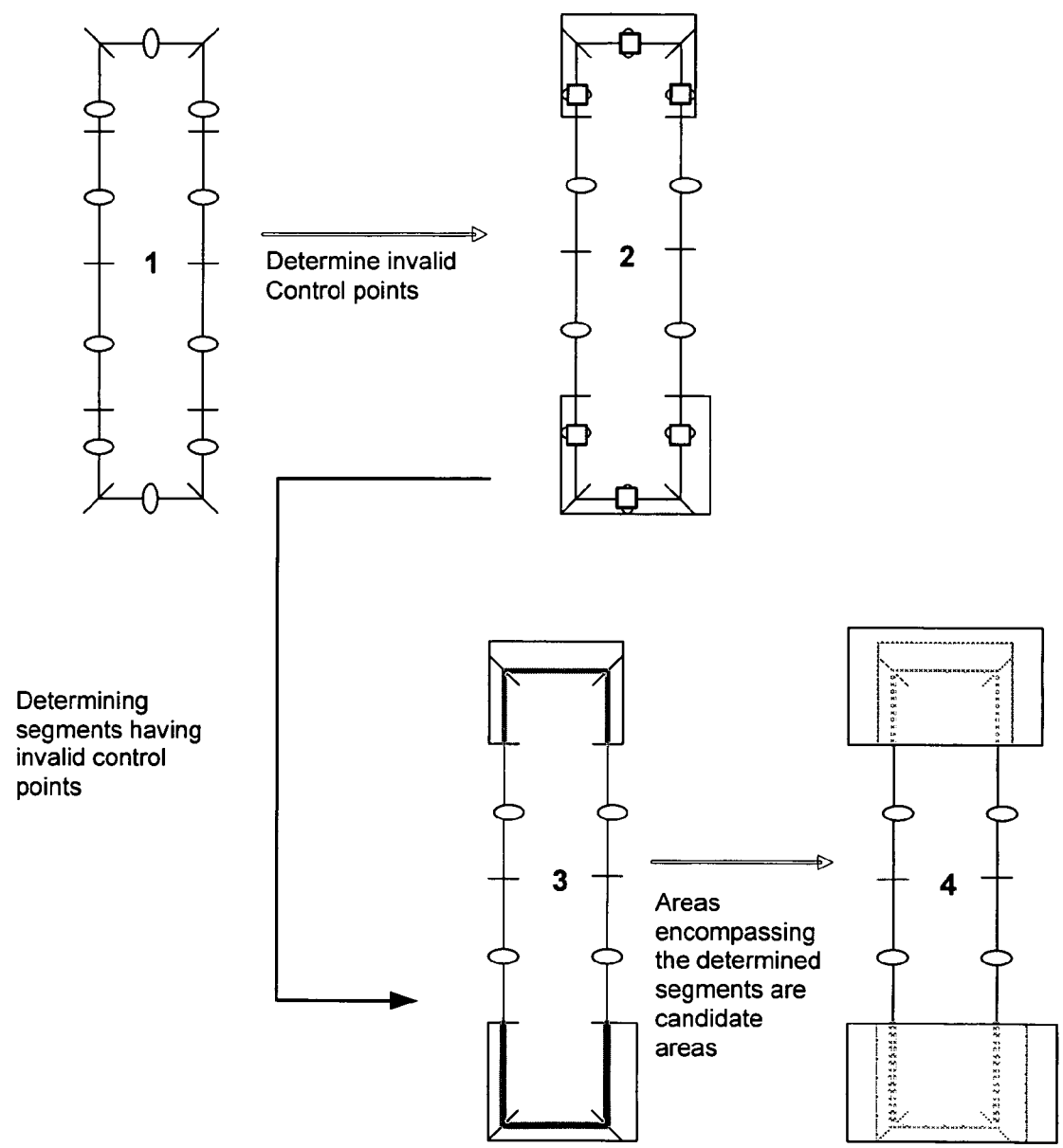
FIG. 8 illustrates an exemplary process for determining candidate areas.
Figure 9:
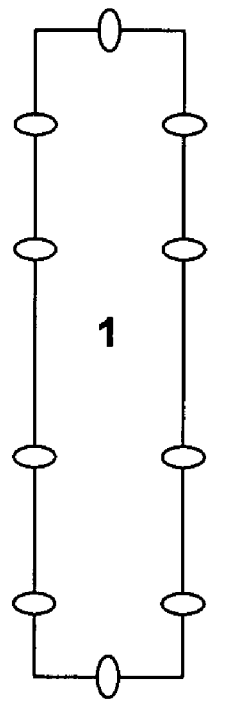
FIG. 9 illustrates another exemplary process for determining candidate areas.
Figure 9:
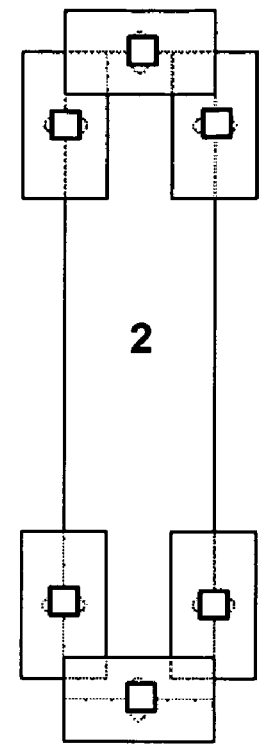

6G to candidate areas. FIGS. 8 and 9 to be described in Section III below illustrate two exemplary processes for mapping invalid control points to candidate areas on a cell.

At step 555, the modified cell and candidate areas for the cell are outputted.

In an exemplary implementation, other layer(s) of the same cell may be processed by repeating the steps of FIG. 5 until each cell is completely processed (i.e., all the layers of the cell that should be processed have been processed) then the iteration continues on to the first layer of the next cell until all the cells of one or more libraries are processed.

In another exemplary implementation, the same layer (e.g., the polysilicon layer) in each of the cells of one or more libraries is processed by repeating the steps of FIG. 5 until that layer in all the cells has been processed then the iteration may continue on to the next layer (e.g., the diffusion layer) for all the cells until all the layers that should be processed have been processed.

FIG. 6H illustrates a modified cell having one layer modified. The modified cell includes candidate areas indicating portions of the cell for further processing. The modified cell in FIG. 6H can be used to replace any corresponding layer of a corresponding unmodified cell in a device layout (already designed or yet to be designed) to reduce computational costs during the mask correction phase of the device manufacturing process. When processing this modified cell, additional mask corrections may be required to modify portions of the cell identified by the candidate areas based on actual neighboring features near the cell, while other areas on the cell do not need to be further modified because they have already been determined to be valid (regardless of the neighboring features that may be actually near the cell).

In an exemplary implementation, the output of the exemplary process of FIG. 5 may be stored in a database (internal or external) accessible by a mask correction process for replacing unmodified cells in an input layout with modified cells of the modified library prior to performing mask corrections (in this case, of portions of the cell indicated by the candidate areas). In another exemplary implementation, the output of the exemplary process of FIG. 5 may be directly stored in the library database (e.g., by replacing the layout view of each cell with its modified version). In this implementation, a designer may used this modified library to directly design device layouts.

Figure 19:
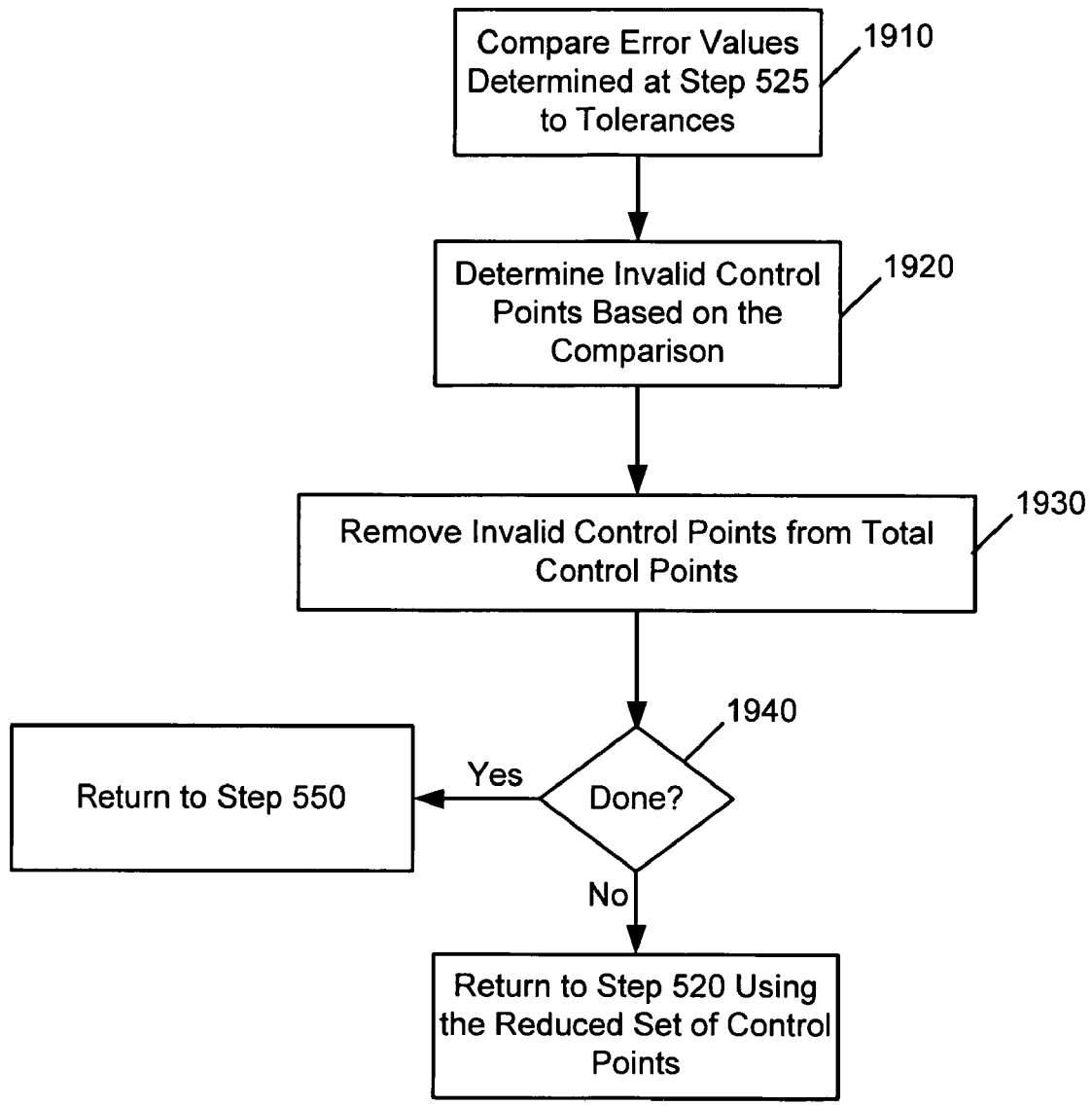
FIG. 19 illustrates another exemplary process for determining invalid control points.

Referring back to Step 525, an alternative process will now be described with reference to FIG. 19. This alternative process should be considered as an alternative implementation replacing steps 535-545 of FIG. 5.

At step 1910, the error values determined at step 525 at the control points are compared to pre-specified tolerances.

At step 1920, the control points having error values outside of the tolerances are determined to be invalid.

At step 1930, the invalid control points are removed from the total control points.

At step 1940, whether enough sets of computer-generated features have been applied is determined. In an exemplary implementation, multiple sets of computer-generated features are used to obtain a more statistically significant quantitative analysis. If not enough sets have been applied, the process returns to step 520 and another set of computer-generated features at least partially within the uncertain region is applied to determine additional error values at the remaining control points of the cell.

At the next application of an additional set of computer-generated features, the remaining control points are determined to be valid or invalid at steps 1920 and 1930 to remove additional invalid control points from the total control points for the next iteration.

When enough sets of computer-generated features have been applied, the process returns to step 550 where candidate areas are determined based on the invalid control points. The process may alternatively terminate if all the control points determined to be invalid before enough sets of computer-generated features have been applied. In this case, the output of the process will indicate that the entire cell requires further processing during a later mask correction process of an integrated-circuit layout.

III. Exemplary Processes for Determining Candidate Areas

FIG. 8 illustrates an exemplary process for mapping invalid control points to candidate areas on a cell.

At step 1 of the first exemplary process, the segments determined during the conventional mask correction process (e.g., conventional OPC of FIG. 3) of step 515 are obtained and represented on the cell. In this figure the control points are illustrated by ovals. The control points illustrated are merely exemplary. One skilled in the art will recognize that more of fewer control points may be implemented depending on design choice.

At step 2, the invalid control points are determined. In this figure, invalid control points are illustrated by squares overlapping the ovals.

At step 3, segments containing or in close proximity to the invalid control points are determined. In an exemplary implementation, these segments are output as candidate areas.

At step 4, (another exemplary implementation) one or more polygonal areas encompassing the segments are mapped (or determined) as being the candidate areas that indicate portions of the cell that may require further processing.

FIG. 9 illustrates another exemplary process for mapping invalid control points to candidate areas on a cell.

At step 1 of the second exemplary process, control points are represented on the cell. In this figure, the control points are being illustrated by ovals.

At step 2, the invalid control points are expanded into polygonal areas (e.g., rectangles) encompassing those points. In this figure, invalid control points are being illustrated by squares overlapping some of the ovals. The size of the areas can be determined based on one or more of many possible parameters. For example, the size may be determined based on experiments (simulated or actual). In another example, the size may be proportional to the interactive range of the cell or features (e.g., the width is equal to half of the interactive range). The polygonal areas around invalid control points are mapped as being the candidate areas that indicates portions of the cell that may require further processing (e.g., further OPC process).

The exemplary processes described above for mapping invalid control points to candidate areas are merely illustrative. One skilled in the art will recognize that other processes may be employed to determined candidate areas in different output forms (e.g., segments, polygonal areas, etc.) based on invalid control points or representations other than control points (e.g., aerial image, simulated image contour, etc.). Further, the indications of candidate areas are readable by a mask correction process (e.g., OPC) so that further mask corrections may be performed on the portions of the cells indicated by the candidate areas.

IV. An Exemplary Cell in a Library

This section describes an exemplary standard cell whose one or more parameters obtained from its library can be used to determine its active cell region, uncertain regions of different layers of the cell, and/or other information that may be useful for applying computer-generated features near the cell (e.g., see step 520).

Figure 10A:
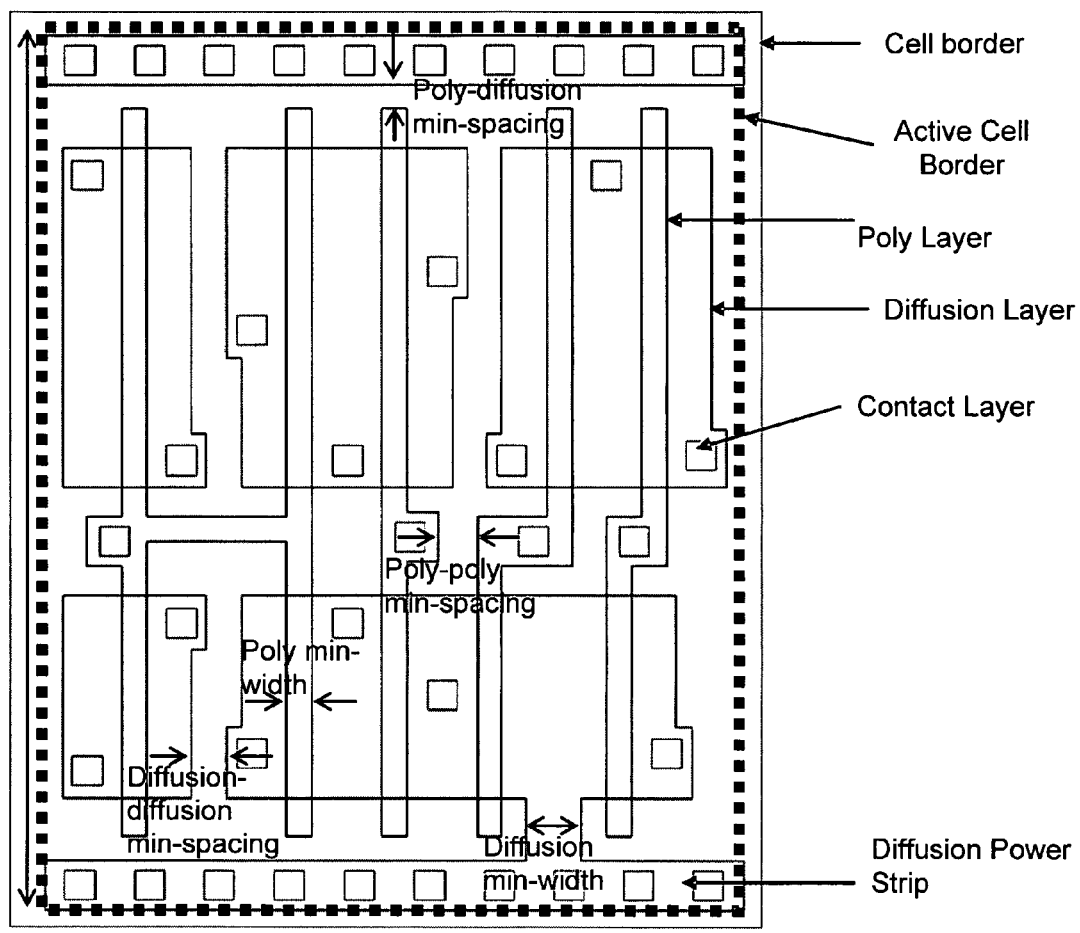
FIG. 10A illustrates an exemplary standard cell.

FIG. 10A illustrates an exemplary standard cell of a library. Generally, standard cells are extensively used in any integrated circuit device layout. FIG. 10A illustrates a cell border, an active cell border (bold dotted lines), and multiple layers of the cell. Specifically, FIG. 10A illustrates the polysilicon layer (illustrated as narrow and long polygons), the diffusion layer (illustrated as wider polygons generally intersecting the polysilicon polygons), and the contact layer (illustrated as square contact holes). These layers overlap each other and are modified separately by applying, for example, the exemplary process of FIG. 5. The cell border indicates the border of the cell, which, in another implementation (not shown) may coincide with the active cell border. The active cell border indicates the border of the active cell region. An active cell region encompasses the space where all features of the cell (regardless of layer) reside. Typically, the active cell region of a cell is the simplified aggregate (usually rectangular) of the active containers of all the layers of the cell.

The library typically describes minimum cell dimensions that include, without limitation, minimum polysilicon (poly) width, minimum diffusion width, poly-poly minimum spacing, diffusion-diffusion minimum spacing, and poly-diffusion minimum spacing. Other information regarding the cell may also be described. For example, the library may indicate that a standard cell includes diffusion power strips at the top and bottom of the cell.

Certain properties of the cell features may be derived from the above parameters. For example, for the standard cell of FIG. 10A, all the diffusion layer geometries other than the power strips are at least ½ diffusion-diffusion minimum spacing from the left and right active cell borders, and all the polysilicon layer geometries are at least ½ poly-poly minimum spacing from the left and right active cell borders and at least poly-diffusion minimum spacing away from the diffusion power strips (or poly-diffusion minimum spacing plus diffusion power strip width away from the top and bottom active cell border).

Figure 12:
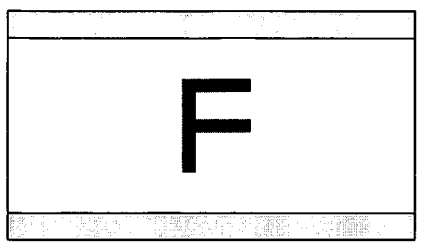
FIG. 12 illustrates exemplary placement orientations of the standard cell as defined in the library.
Figure 12:
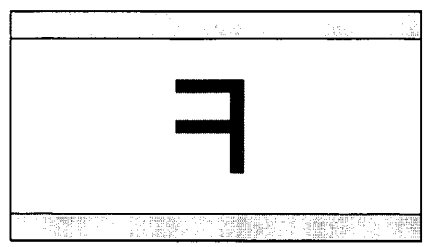
Figure 12:
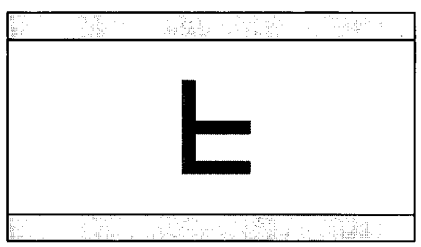
Figure 12:
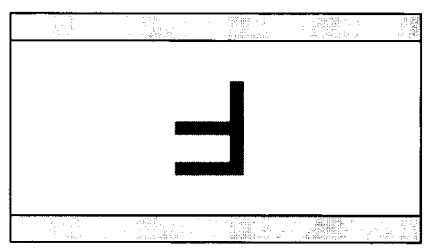

In addition, standard cells are generally required to be horizontally aligned (i.e., the active cell borders of two horizontally adjacent cells abut each other). The power strips between horizontally adjacent cells typically connect to each other. And standard cells may be required to be placed in predefined orientations (e.g., up-side-down in every other row). FIG. 12 illustrates four exemplary orientations (i.e., regular placement, horizontal reflection, vertical reflection, and 180 degree rotation) for the standard cell of FIG. 10A. Exemplary placements of standard cells are illustrated in FIG. 13 which will be described in more detail below.

Figure 10B:
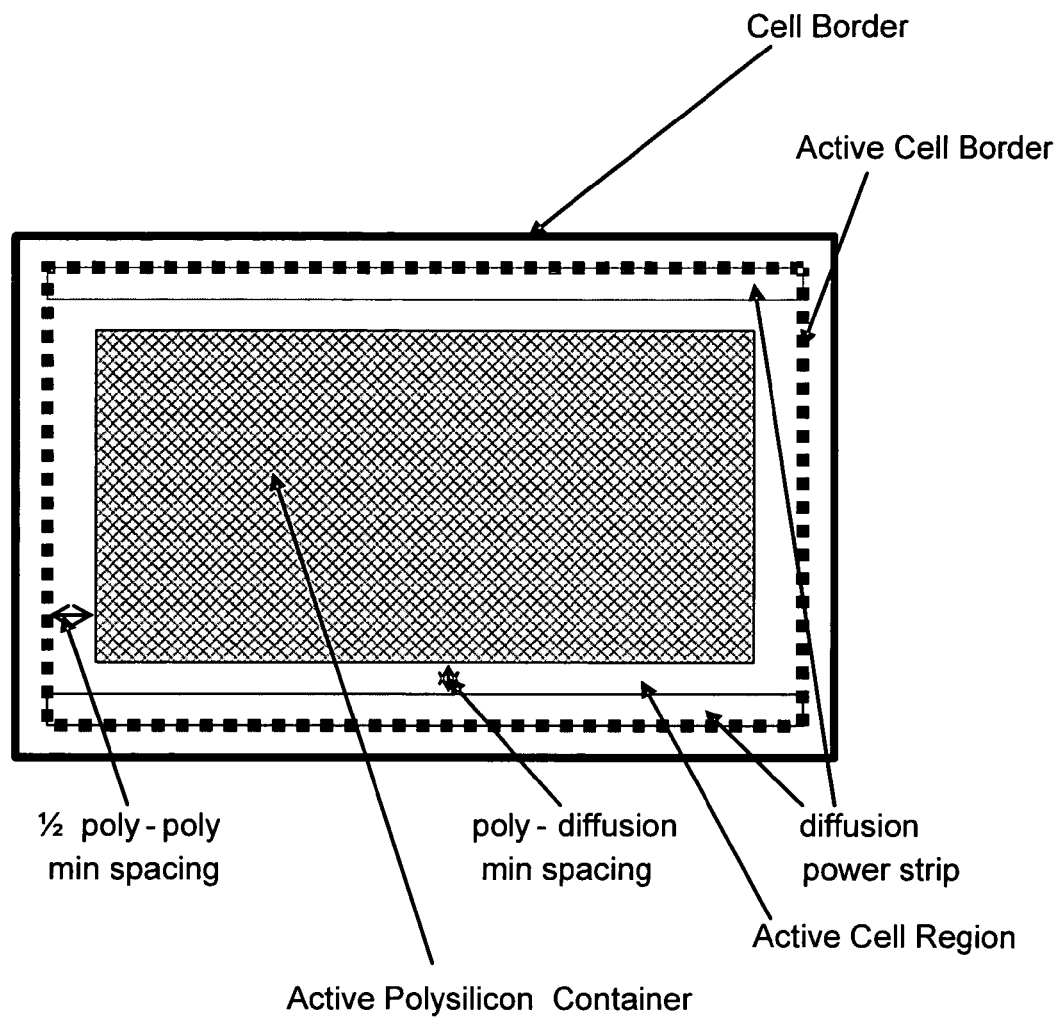
FIG. 10B illustrates an exemplary active polysilicon container of the polysilicon layer of the standard cell.

FIG. 10B illustrates an exemplary active polysilicon container of the standard cell of FIG. 10A. All features of the polysilicon layer are located within the active polysilicon container. The height of the active polysilicon container is offset at the top and bottom from the diffusion power strips by the poly-diffusion minimum spacing. The width of the active polysilicon container is offset at the right and left from the inner active cell border by a ½ poly-poly minimum spacing.

Figure 10C:
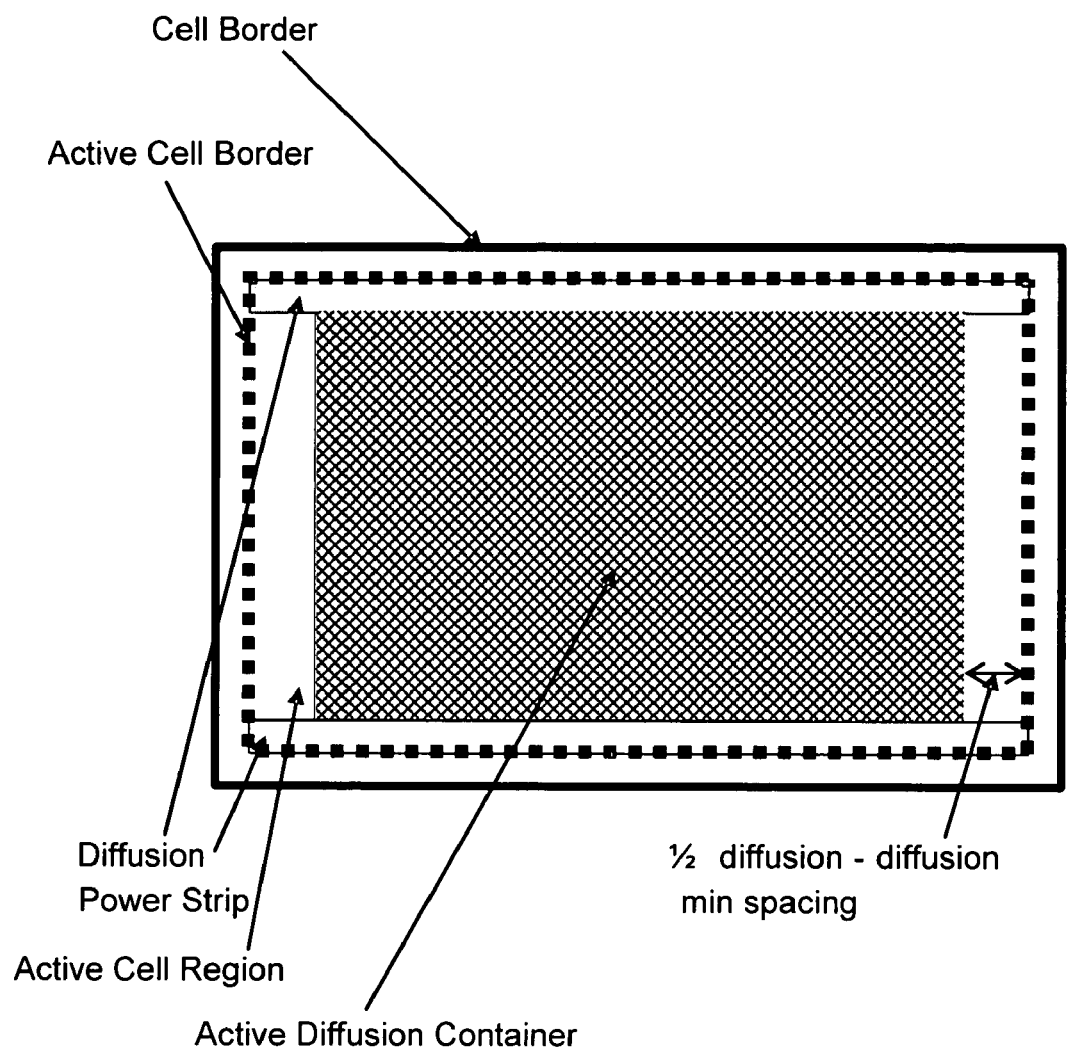
FIG. 10C illustrates an exemplary active diffusion container of the diffusion layer of the standard cell.

FIG. 10C illustrates an exemplary active diffusion container of the standard cell of FIG. 10A. All features of the diffusion layer are located within the active diffusion container. The height of the active diffusion container has no offset at the top and bottom and includes the diffusion power strips. The width of the active diffusion container is offset at the right and left from the inner active cell border by a ½ diffusion-diffusion minimum spacing except for the area containing the power strips which extends to the active cell border.

The parameters specified by the library for each cell can be used to determine the uncertain regions for each layer of the cell. An uncertain region of a layer of a cell represents the area within which potential features from other cells may reside and cause proximity effects on the features within the cell. One is uncertain about the contents of the region because one does not necessarily have information regarding the actual layout of the cell's neighbors. In general, each layer will have its own uncertain region. In an exemplary implementation, the inner boundary of an uncertain region is based on one or more parameters specified in the library for the cell and the outer boundary of the uncertain region is based on the interactive range for the cell. The computer-generated features (i.e., at step 520) are applied within the uncertain region of each layer of a cell to determine any potential proximity effects that may be caused by the computer-generated features may have on the cell.

Figure 11A:
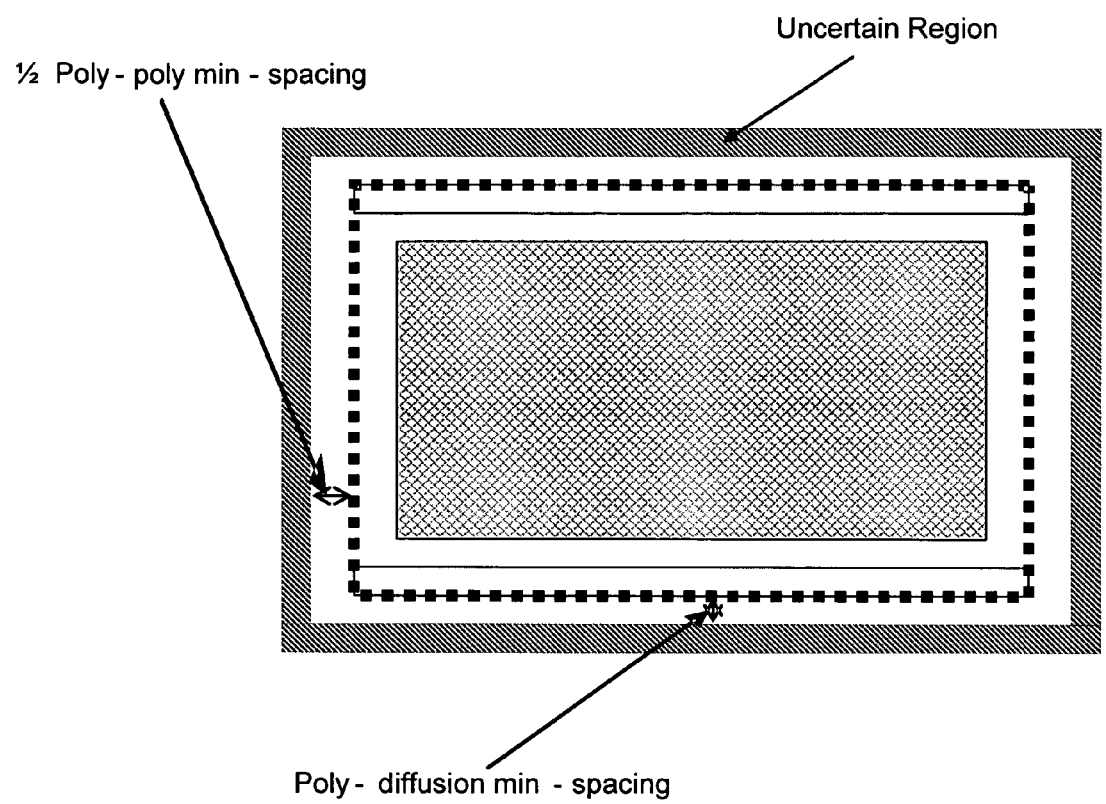
FIG. 11A illustrates an exemplary uncertain region of the polysilicon layer of the standard cell.

FIG. 11A illustrates an exemplary uncertain region for the polysilicon layer of the standard cell of 10A. In FIG. 11A, the inner boundary of the uncertain region is offset from the right and left outer active cell borders by the ½ poly-poly minimum spacing and offset from the top and bottom outer active cell borders by the poly-diffusion minimum spacing. The outer boundary of the uncertain region is offset from the outer active cell border by the interactive range for the standard cell.

Figure 11B:
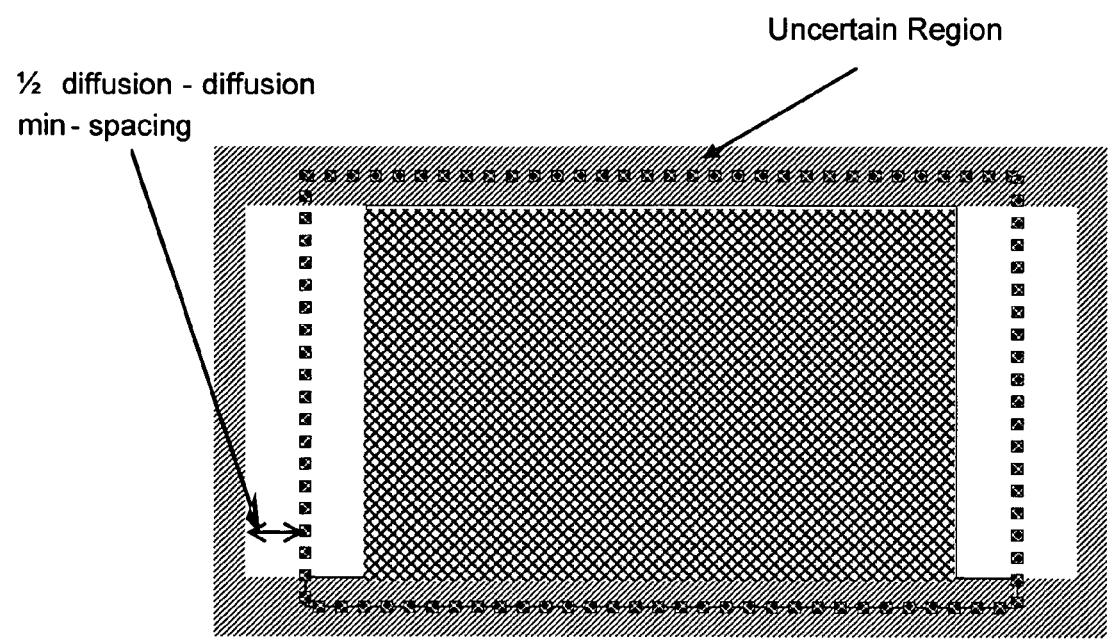
FIG. 11B illustrates an exemplary uncertain region of the diffusion layer of the standard cell.

FIG. 11B illustrates an exemplary uncertain region for the diffusion layer of the standard cell of 10A. In FIG. 11B, the inner boundary of the uncertain region is offset from the right and left outer active cell borders by the ½ diffusion-diffusion minimum spacing except the area next to the diffusion power strips, and has no offset from the top and bottom active cell borders. Depending on actual design, one or more diffusion power strips of a cell may or may not overlap with (or abut) the diffusion power strips of other cells. Thus, one is uncertain about whether the diffusion power strips of a cell extend beyond the active cell border. The outer boundary of the uncertain region is offset from the outer active cell border by the interactive range for the standard cell.

In general, the area between the active cell border and the uncertain region is empty or may contain features whose shapes and locations are known and will not change. Thus, one does not need to apply computer-generated features in this area.

Figure 13A:
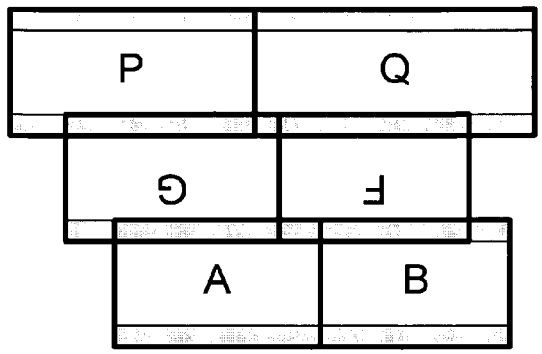
FIGS. 13A-C illustrate exemplary cell spacing configurations in accordance with specifications in the library.
Figure 13B:
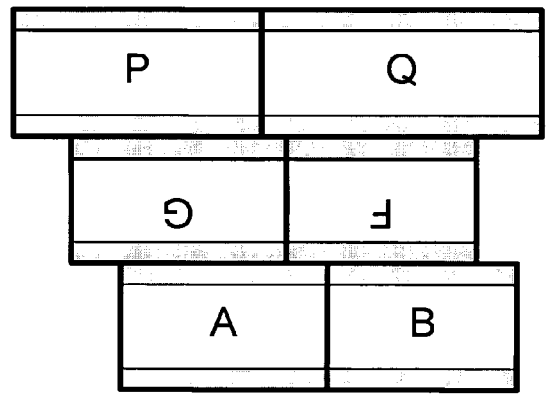
Figure 13C:
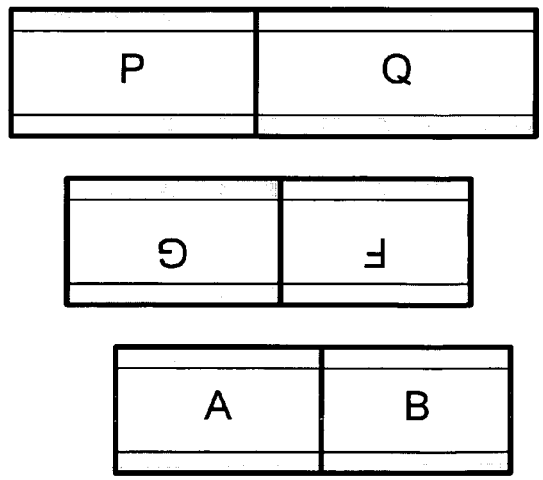

Placement rules specified in a library determine how the cells can be placed in an integrated-circuit layout. FIGS. 13A-C illustrate exemplary placements of the standard cell of FIG. 10A. Each cell shown in FIGS. 13A-C is a standard cell. In FIG. 13A, the standard cells are horizontally aligned and the diffusion power strips of vertical neighbors are overlapping each other. In FIG. 13B, the standard cells are horizontally aligned and the diffusion power strips of vertical neighbors are abutting each other. In FIG. 13C, the standard cells are horizontally aligned and the diffusion power strips of vertical neighbors are spaced apart from each other by at least the diffusion-diffusion minimum spacing.

Different placement options may affect the shape and size of the uncertain region. FIG. 11A illustrates the uncertain region for the placement style of FIG. 13A. However, if the placement style of FIG. 13C were implemented for a polysilicon layer, the inner boundary of the uncertain region will be farther from the active cell border (i.e., by the diffusion power strip width plus the poly-diffusion minimum spacing and diffusion minimum spacing).

The parameters described above for standard cells are merely exemplary. One skilled in the art will recognize that other parameters and placement rules may be specified in the library for the standard cell and other cells. Furthermore, the exemplary techniques described above for determining the active cell region and the uncertain region for each layer of a cell are merely illustrative. One skilled in the art will recognize that other techniques may be applied using information obtained from the library.

The standard cell library described above is merely exemplary. One skilled in the art will recognize that parameters in other types of libraries (e.g., memories, I/Os, Analog, etc.) may be similarly used to determine active cell regions, uncertain regions of different layers of a cell, and/or other information that may be useful for applying computer-generated features near the cell (e.g., see step 520).

Figure 14:
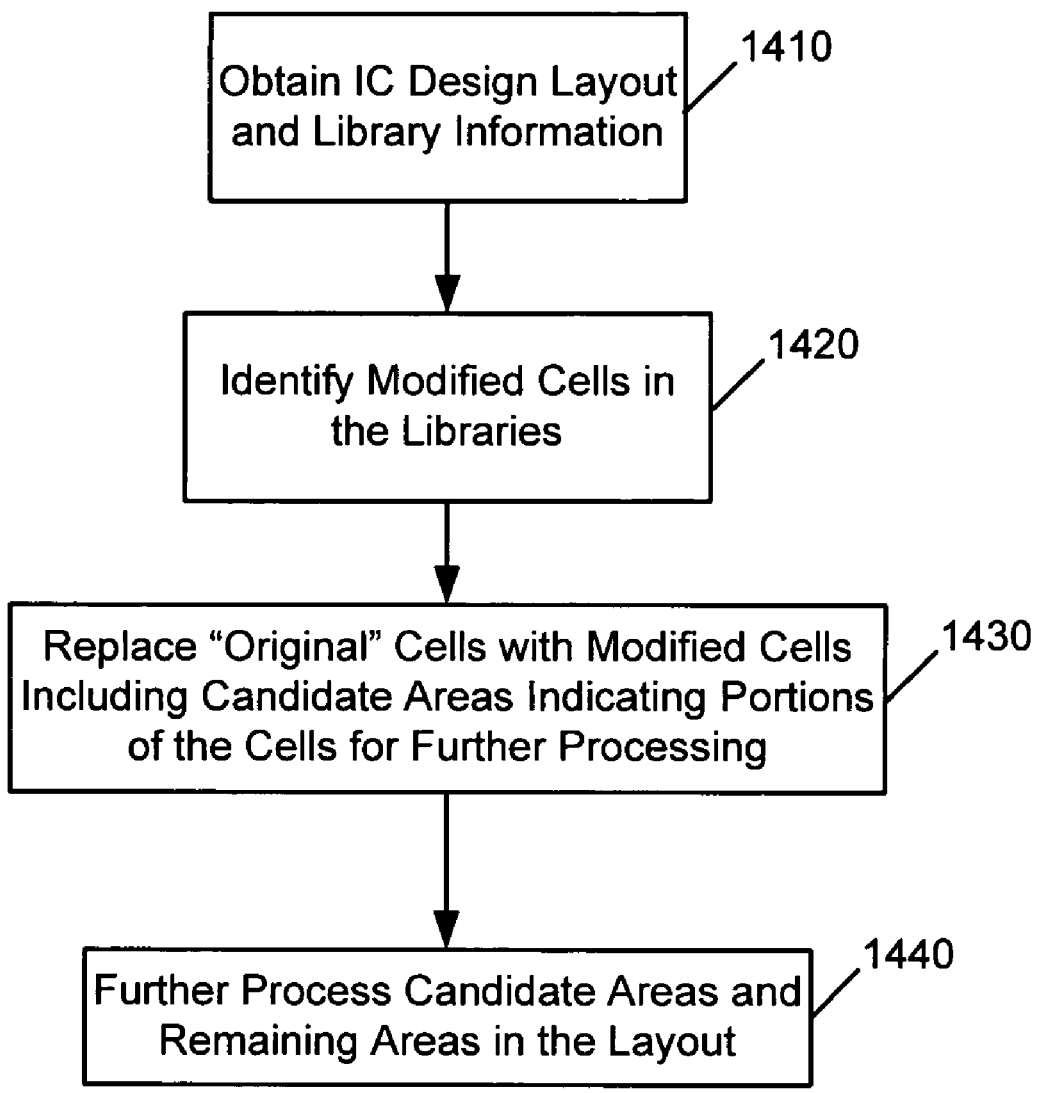
FIG. 14 illustrates an exemplary process for improving an OPC process by using modified libraries of cells.

V. Exemplary Processes for Using a Modified Library to Enhance a Mask Correction process FIG. 14 illustrates an exemplary process for using a modified library in a mask correction process, such as an OPC process. This exemplary process assumes that an integrated circuit device layout has already been designed without using modified cells.

At step 1410, the integrated circuit device layout and library information relating to the libraries used to design the layout are obtained.

At step 1420, modified cells in the libraries are identified. In an exemplary implementation, each modified cell has been previously modified by a mask correction process and includes candidate areas indicating portions of the cell for further processing (e.g., by applying the process of FIG. 5). In one implementation, the layout is reviewed to identify cells that have corresponding modified cells in the modified libraries.

At step 1430, original library cells in the layout are replaced with modified library cells.

At step 1440, the modified layout is ready to be processed by a mask correction process (e.g., an OPC process) which may further modify the portions of the modified cells indicated by the candidate areas of each replaced modified cell (as well as any remaining unmodified portions of the layout).

Figure 15:
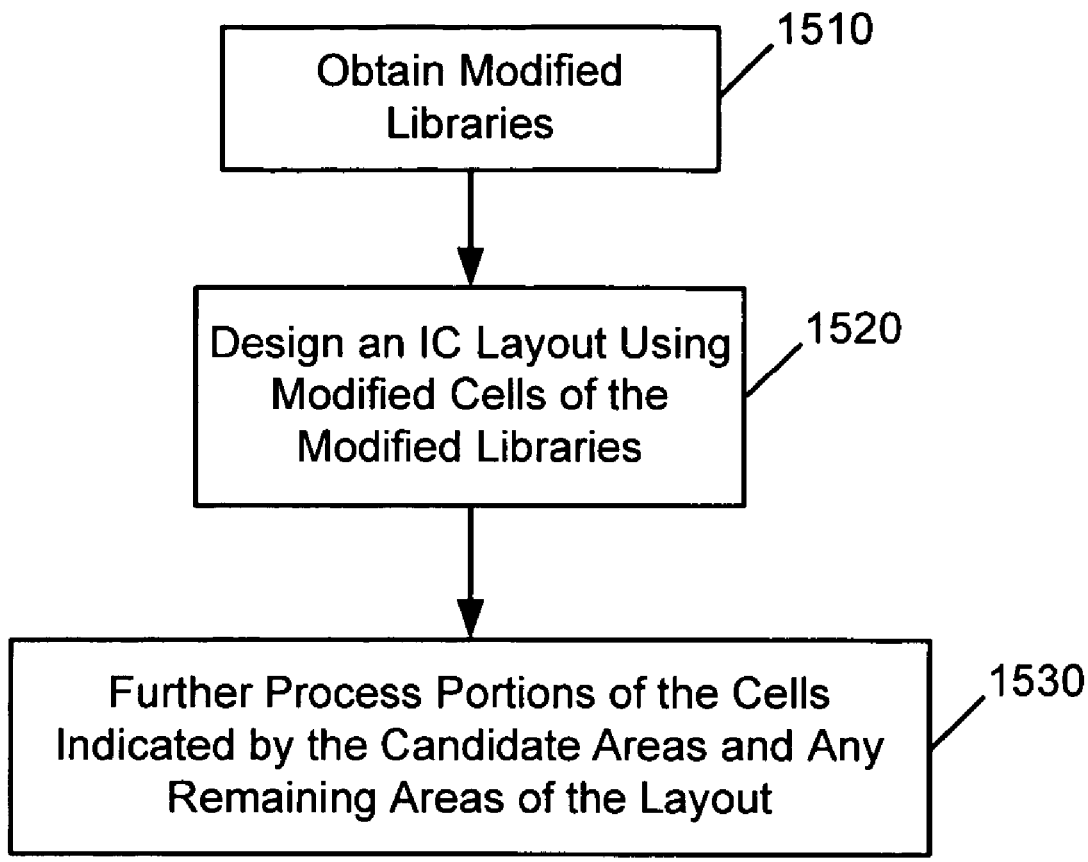
FIG. 15 illustrates an exemplary process for designing integrated circuits with modified libraries of cells.

FIG. 15 illustrates an exemplary process for using a modified library to design an integrated circuit device layout.

At step 1510, a designer obtains modified libraries. The modified libraries include modified cells. In an exemplary implementation, each modified cell has been previously modified by a mask correction process and includes candidate areas.

At step 1520, the designer designs a physical layout using modified cells from the modified library.

At step 1530, the layout is ready to be processed by a mask correction process (e.g., an OPC process) which may further modify the portions of each cell indicated by the candidate areas of the cell (as well as any remaining unmodified portions of the layout).

A layout designed by this exemplary process will substantially reduce any subsequent mask correction computations because at least some of the cells in the layout have already been substantially corrected to compensate for proximity effects except for remaining portions indicated by candidate areas that may require further mask corrections.

VI. An Exemplary Operating Environment

The embodiments described herein may be implemented in an operating environment comprising software installed on a computer, in hardware, or in a combination of software and hardware.

The software and/or hardware would typically include some type of computer-readable media which can store data and logic instructions that are accessible by the computer or the processing logic within the hardware. Such media might include, without limitation, hard disks, floppy disks, flash memory cards, digital video disks, random access memories (RAMs), read only memories (ROMs), and the like.

VII. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims. Furthermore, some of the claims may include alphanumeric identifiers to distinguish the elements thereof. Such identifiers are merely provided for convenience in reading, and should not necessarily be construed as requiring or implying a particular order of steps, or a particular sequential relationship among the claim elements.

What is claimed is:

1. A method for designing an integrated circuit using a library of cells, wherein at least one of said cells is modified by a process carried out by instructions stored in or on a computer-readable storage medium executed by a processor, comprising the steps of:
   (a) obtaining at least one parameter related to a given cell having at least one feature;
   (b) determining an uncertain region based on said parameter, said uncertain region being an area near said given cell where at least one feature from at least one neighboring cell, if located within said uncertain region, affects implementation of said at least one feature of said given cell;
   (c) determining a plurality of computer-generated features at least partially within said uncertain region to determine one or more candidate areas indicating portions of said given cell for further processing, comprising:
      selecting a plurality of control points of said given cell;
      determining a performance metric value at each control point;
      comparing said performance metric values to tolerances of said given cell;
      determining invalid control points based on said comparing; and
      mapping said invalid control points to candidate areas on said given cell; and
   (d) outputting said given cell and said candidate areas to produce a modified cell.

2. The method of claim 1, further comprising, prior to said step (c), processing said given cell to compensate for a manufacturing effect.

3. The method of claim 2, wherein said compensate includes correcting a distortion.

4. The method of claim 2, further comprising, prior to step (c), the step of applying a nominal set of computer-generated features near said given cell to determine any proximity effects on said given cell caused by said nominal set of computer-generated features.

5. The method of claim 1, wherein said determine one or more candidate areas includes:
    determining a plurality of distributions of performance metric values at control points of said given cell;
    comparing said distributions to tolerances of said given cell;
    determining invalid control points based on said comparing; and
    mapping said invalid control points to candidate areas on said given cell.

6. A system for designing an integrated circuit using a library of cells, wherein at least one of said cells is modified by instructions stored in or on a computer-readable storage medium executed by a processor, the instructions comprising:
    (a) instructions to obtain at least one parameter related to a given cell having at least one feature;
    (b) instructions to determine an uncertain region based on said parameter, said uncertain region being an area near said given cell where at least one feature from at least one neighboring cell, if located within said uncertain region, affects implementation of said at least one feature of said given cell;
    (c) instructions to determine a plurality of computer-generated features at least partially within said uncertain region to determine one or more candidate areas indicating portions of said given cell for further processing, comprising:
        instructions to select a plurality of control points of said given cell;
        instructions to determine a performance metric value at each control point;
        instructions to compare said performance metric values to tolerances of said given cell;
        instructions to determine invalid control points based on said comparing; and
        instructions to map said invalid control points to candidate areas on said given cell; and
    (d) instructions to output said given cell and said candidate areas to produce a modified cell.

7. The system of claim 6, further comprising instructions to process said given cell to compensate for a manufacturing effect.

8. The system of claim 7, wherein said compensate includes correcting a distortion.

9. The system of claim 7, further comprising instructions to apply a nominal set of computer-generated features near said given cell to determine any proximity effects on said given cell caused by said nominal set of computer-generated features.

10. The system of claim 6, wherein said instructions to determine one or more candidate areas comprise:
    instructions to determine a plurality of distributions of performance metric values at control points of said given cell;
    instructions to compare said distributions to tolerances of said given cell;
    instructions to determine invalid control points based on said comparing; and
    instructions to map said invalid control points to candidate areas on said given cell.

* * * * *